(12) United States Patent
Hashizume et al.

(10) Patent No.: US 10,896,826 B2
(45) Date of Patent: Jan. 19, 2021

(54) METHOD FOR FABRICATING SEMICONDUCTOR DEVICE AND LEAD FRAME

(71) Applicant: Renesas Electronics Corporation, Tokyo (JP)

(72) Inventors: Shoji Hashizume, Gunma (JP); Shinichi Nishimura, Gunma (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 32 days.

(21) Appl. No.: 16/048,403

(22) Filed: Jul. 30, 2018

(65) Prior Publication Data

US 2019/0122900 A1  Apr. 25, 2019

(30) Foreign Application Priority Data

Oct. 24, 2017  (JP) .................. 2017-205579

(51) Int. Cl.
*H01L 21/56* (2006.01)
*H01L 23/00* (2006.01)
(Continued)

(52) U.S. Cl.
CPC .......... *H01L 21/565* (2013.01); *H01L 21/561* (2013.01); *H01L 23/49541* (2013.01);
(Continued)

(58) Field of Classification Search
CPC ............. H01L 21/561; H01L 21/565; H01L 23/49541; H01L 24/97; H01L 23/49513;
(Continued)

(56) References Cited

U.S. PATENT DOCUMENTS 5,293,065 A * 3/1994 Chan ............... H01L 21/565
257/667
5,578,261 A * 11/1996 Manzione ......... B29C 45/14655
264/272.15
(Continued)

FOREIGN PATENT DOCUMENTS

| JP | 05-169483 A | 7/1993 |
|---|---|---|
| JP | 08-197570 A | 8/1996 |
| JP | 2010-149423 A | 7/2010 |

*Primary Examiner* — Dale E Page
*Assistant Examiner* — Quovaunda Jefferson
(74) *Attorney, Agent, or Firm* — Mattingly & Malur, PC

(57) ABSTRACT

The method of the present invention improves quality and reliability of resin mold-type semiconductor devices. The method includes the steps of placing a lead frame such that cavities of a mold match with device formation regions of the lead frame, respectively, and forming encapsulation bodies that encapsulate semiconductor chips by flowing encapsulating resin into the cavities. The mold with an upper mold half and a lower mold half clamped together has a plurality of first gates that allow the cavities to communicate with a runner, and a dummy-cavity gate that allows a dummy cavity to communicate with the runner. During a resin molding process, from the time when the resin starts flowing into the mold to the time when the encapsulation bodies are formed, an orifice of each cavity gate is larger in size than an orifice of the dummy-cavity gate.

11 Claims, 20 Drawing Sheets

(51) Int. Cl.
*H01L 23/495* (2006.01)
*H01L 23/31* (2006.01)

(52) U.S. Cl.
CPC .......... *H01L 24/97* (2013.01); *H01L 23/3107* (2013.01); *H01L 23/49513* (2013.01); *H01L 24/32* (2013.01); *H01L 24/45* (2013.01); *H01L 24/48* (2013.01); *H01L 24/73* (2013.01); *H01L 24/92* (2013.01); *H01L 2224/04042* (2013.01); *H01L 2224/29139* (2013.01); *H01L 2224/32245* (2013.01); *H01L 2224/45144* (2013.01); *H01L 2224/45147* (2013.01); *H01L 2224/48247* (2013.01); *H01L 2224/73265* (2013.01); *H01L 2224/92247* (2013.01); *H01L 2224/97* (2013.01)

(58) Field of Classification Search
CPC ......... H01L 24/32; H01L 24/48; H01L 24/92; H01L 24/45; H01L 2224/92247; H01L 2224/32245; H01L 2224/29139; H01L 2224/48247; H01L 2224/73265; H01L 2224/45144; H01L 2224/45147; H01L 2224/04042; H01L 2224/97

See application file for complete search history.

(56) References Cited

U.S. PATENT DOCUMENTS

| | | | |
|---|---|---|---|
| 6,413,801 B1* | 7/2002 | Lin | H01L 21/565 |
| | | | 257/E21.504 |
| 2003/0153130 A1* | 8/2003 | Kuratomi | H01L 21/565 |
| | | | 438/123 |
| 2005/0037104 A1* | 2/2005 | Kao | H01L 21/565 |
| | | | 425/116 |

* cited by examiner

METHOD FOR FABRICATING SEMICONDUCTOR DEVICE AND LEAD FRAME

CROSS REFERENCE TO RELATED APPLICATIONS

The disclosure of Japanese Patent Application No. 2017-205579 filed on Oct. 24, 2017 including the specification, drawings and abstract is incorporated herein by reference in its entirety.

BACKGROUND

This invention relates to, for example, technologies of fabricating resin mold-type semiconductor devices, and lead frames used to fabricate the semiconductor devices.

The structure of molds used during assembly of resin mold-type semiconductor devices is disclosed in Japanese Unexamined Patent Application Publication Nos. 2010-149423 (Patent Literature 1), Hei 8(1996)-197570 (Patent Literature 2), and Hei 5(1993)-169483 (Patent Literature 3).

SUMMARY

Among various types of molds, molds of the type in which resin flows from a pot to a plurality of cavities via a plurality of runners diverted from the pot, cause the resin to be injected to a cavity at the last after filling up all the other cavities due to the properties of the resin, processing variations of gates provided for the cavities, and some other factors. During the resin injection process, the feed rate of the resin pushed out by a plunger is constant from beginning to end, and consequently the resin is injected to the last cavity at a higher injection speed, which easily causes wire sweep.

Japanese Unexamined Patent Application Publication No. 2010-149423 discloses a structure of a mold, which is used in transfer molding, including a movable gate at a runner, and a resin sump formed adjacent to the movable gate. In this case, the opening size of the movable gate when the molding is finished becomes very small, and removal of the runner and resin sump entails breakage and scattering of the resin sump, consequently making it difficult to continuously perform the molding process. Or, the resin in the resin sump is broken and fallen off at the movable gate during demolding, which may damage the mold with an increasing probability.

In the molds (resin sealing mold, resin molding device) disclosed in Japanese Unexamined Patent Application Publication No. Hei 8(1996)-197570 and Japanese Unexamined Patent Application Publication No. Hei 5(1993)-169483, product cavities are last injected with resin at a high flow velocity, and therefore, wires are easily deformed.

Other problems and novel features will become apparent from the following description in the specification and the accompanying drawings.

A method for fabricating a semiconductor device according to an embodiment includes the steps of: (a) providing a lead frame having a plurality of device formation regions and a frame section; (b) placing a plurality of semiconductor chips over the device formation regions; (c) placing the lead frame in a mold having a plurality of cavities, a dummy cavity, and a runner such that the cavities match with the device formation regions. The method further includes the steps of: (d) forming encapsulation bodies that encapsulate the semiconductor chips by flowing encapsulating resin into the cavities through the runner; and (e) taking out the lead frame from the mold. After the step (c), the mold with an upper mold half and a lower mold half clamped together has a plurality of first gates that allow the cavities to communicate with the runner, and a second gate that allows the dummy cavity to communicate with the runner. In the step (d), from the time when the encapsulating resin starts flowing into the mold to the time when the encapsulation bodies are formed in the mold, the size of an orifice of each of the first gates is larger than an orifice of the second gate.

The lead frame according to the embodiment includes a plurality of device regions each having dam bars supporting the leads, and a frame section arranged around the device regions and including a plurality of first holes formed for each of the device regions. Furthermore, where the direction in which the first holes are aligned is defined as a first direction and the direction perpendicular to the first direction is defined as a second direction, each of the device regions includes a gate resin sump hole and a suspension-lead base end arranged at a corner of the corresponding device region, the corner being opposed to the gate resin sump hole in the first direction. Here, the direction proceeding from the gate resin sump hole to the suspension-lead base end is defined as a third direction. A second hole is formed in the frame section near a device region located closest to an edge of the lead frame in the third direction. The second hole is also located between extension lines extending from the two opposed dam bars, respectively, provided along the second direction, and is located beyond a first hole, which is closest to the edge among the first holes aligned in the third direction, toward the third direction. The width of the second hole in the second direction is narrower than the width of the first hole in the second direction.

According to the aforementioned embodiment, the resin mold-type semiconductor device can have improved quality and reliability.

DETAILED DESCRIPTION

Figure 1:
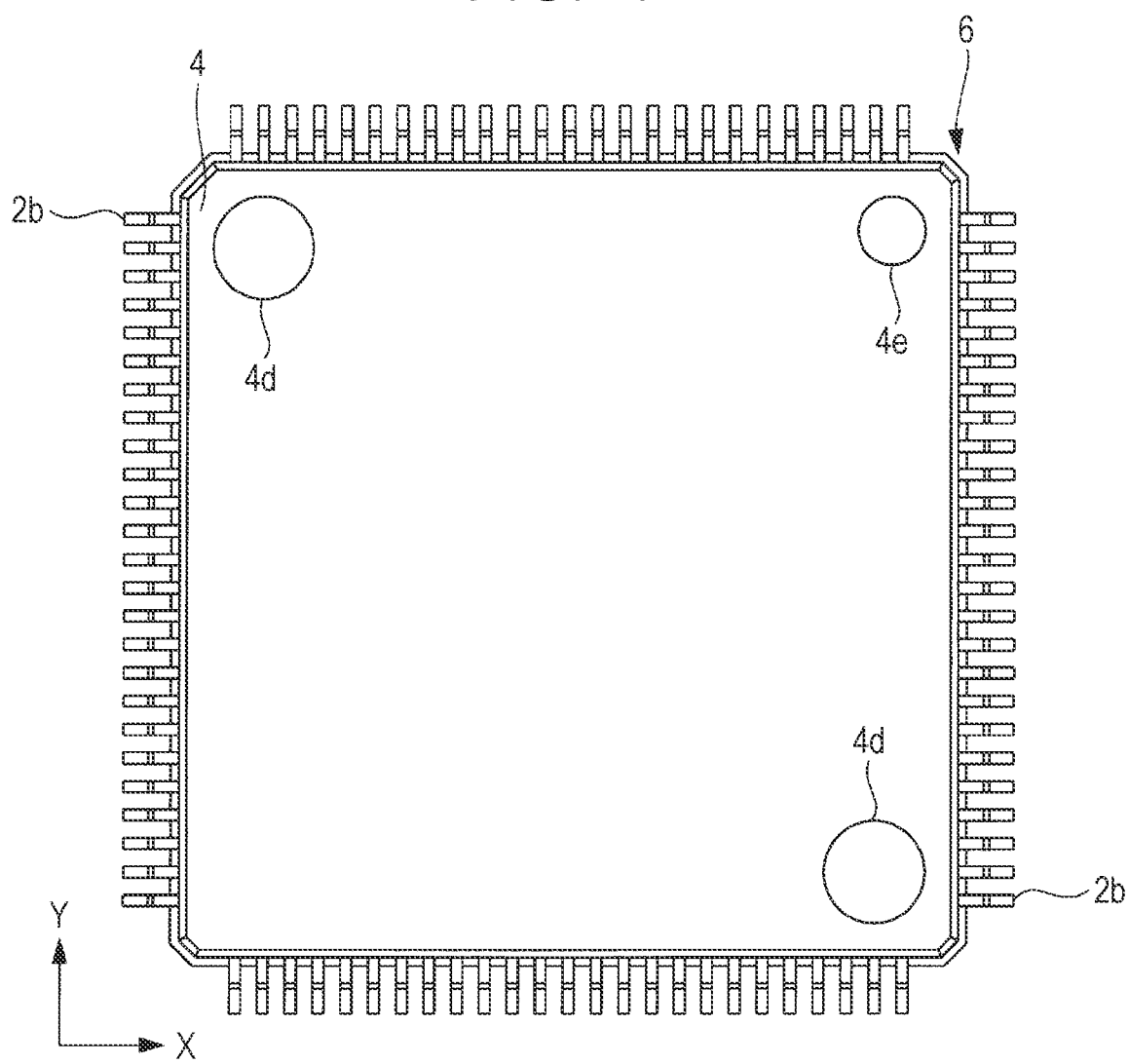
FIG. 1 is a plan view showing an example structure of a semiconductor device according to an embodiment.

Description of the same or similar portions is not repeated in principle unless particularly required in the embodiments described below.

In the following embodiment, if necessary for convenience, the embodiment will be divided into a plurality of sections or embodiments in the description; however, excepting the case that is particularly demonstrated, these are not independent of each other, but are in a relationship in which one is a variation(s) of part or all of the other, a detailed description, a supplementary description, or the like.

Also, in the following embodiment, the number of components (including pieces, numerical value, amount, range, etc.) is not limited to the particular number unless explicitly stated or specifically being limited to the particular number in principle, and may be more than or less than the described number.

In addition, in the following embodiment, the components (including element steps and the like) are not always indispensable unless explicitly specified or clearly considered indispensable in principle.

Furthermore, in the following embodiment, the expression of the component "has A" or "includes A" does not eliminate the possibility that the component has or includes other elements than A unless explicitly stated that the component has or includes only A. Likewise, in the following embodiment, when the shapes, the positional relationships, and the like of the components are referred to, they are intended to include those substantially close to or similar to the shapes and others, and the like except when explicitly specified or when it is obviously not the case. The same applies to the above-described numerical value and range.

With reference to the accompanying drawings, an embodiment of the present invention will be described below. In all the drawings to describe the embodiment, the same reference numerals are assigned to the components with the same functions, and explanations thereof will not be repeated. In addition, hatch patterns may be sometimes applied to even a plan view for the sake of clarity.

Embodiment

Figure 2:
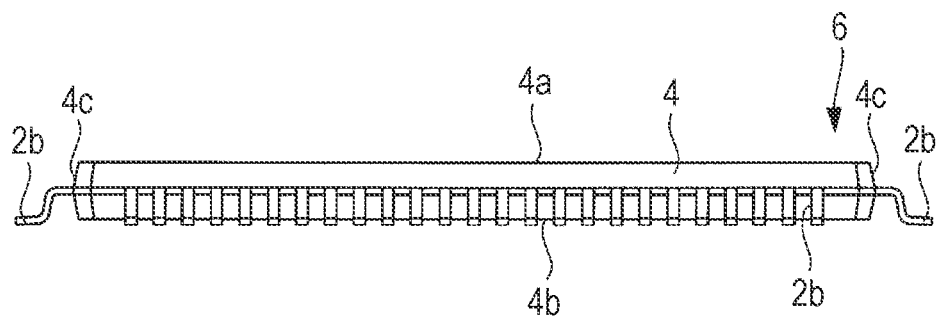
FIG. 2 is a side view showing the example structure of the semiconductor device shown in FIG. 1.
Figure 3:
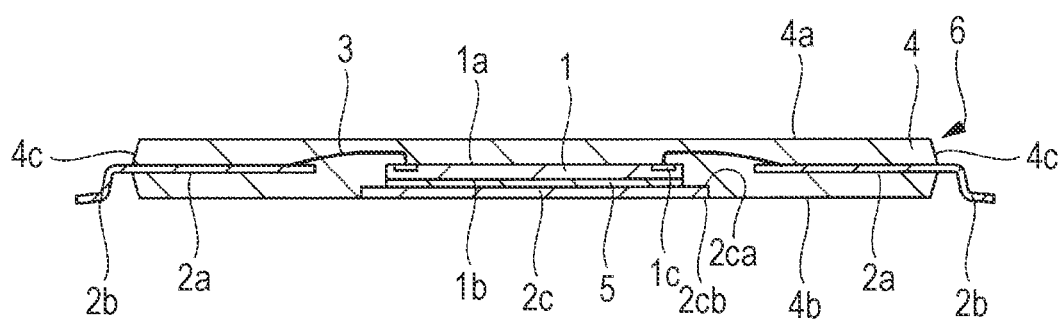
FIG. 3 is a cross-sectional view showing the example structure of the semiconductor device shown in FIG. 1.

FIG. 1 is a plan view showing an example structure of a semiconductor device according to the embodiment, FIG. 2 is a side view showing the example structure of the semiconductor device shown in FIG. 1, and FIG. 3 is a cross-sectional view showing the example structure of the semiconductor device shown in FIG. 1.

<Semiconductor Device>

The semiconductor device of the embodiment shown in FIG. 1 is a resin mold-type semiconductor package assembled with a lead frame. Specifically, the semiconductor device contains a semiconductor chip or the like encapsulated by resin molding during assembly. In this embodiment, a quad flat package (QFP) 6 will be described as an example of the semiconductor device.

Referring to FIGS. 1 to 3, the structure of the QFP 6 of the embodiment will be described. The QFP 6 includes a die pad (chip mounting portion or tab) 2c having an upper face (chip mounting face) 2ca and a lower face 2cb opposite to the upper face 2ca, a semiconductor chip 1 mounted over the die pad 2c, a plurality of leads composed of inner leads 2a and outer leads 2b and arranged along the periphery of the die pad 2c, and an encapsulation body 4.

The semiconductor chip 1 includes a main face (front face) 1a, a plurality of bonding pads (electrode pads, bonding electrodes) 1c formed over the main face 1a, and a back face 1b opposite to the main face 1a. Over the main face 1a of the semiconductor chip 1 formed is a protective film (insulating film), which is not illustrated, such that the bonding pads 1c are exposed. The bonding pads 1c are provided along the periphery of the main face 1a, and used to draw out electrical signals of the semiconductor element.

As shown in FIG. 3, the semiconductor chip 1 is mounted over the upper face 2ca of the die pad 2c with a die bonding material 5 interposed therebetween such that the back face 1b of the semiconductor chip 1 faces the upper face 2ca of the die pad 2c. The die bonding material 5 may be, for example, adhesive paste, such as Ag paste, or high melting point solder.

Figure 8:
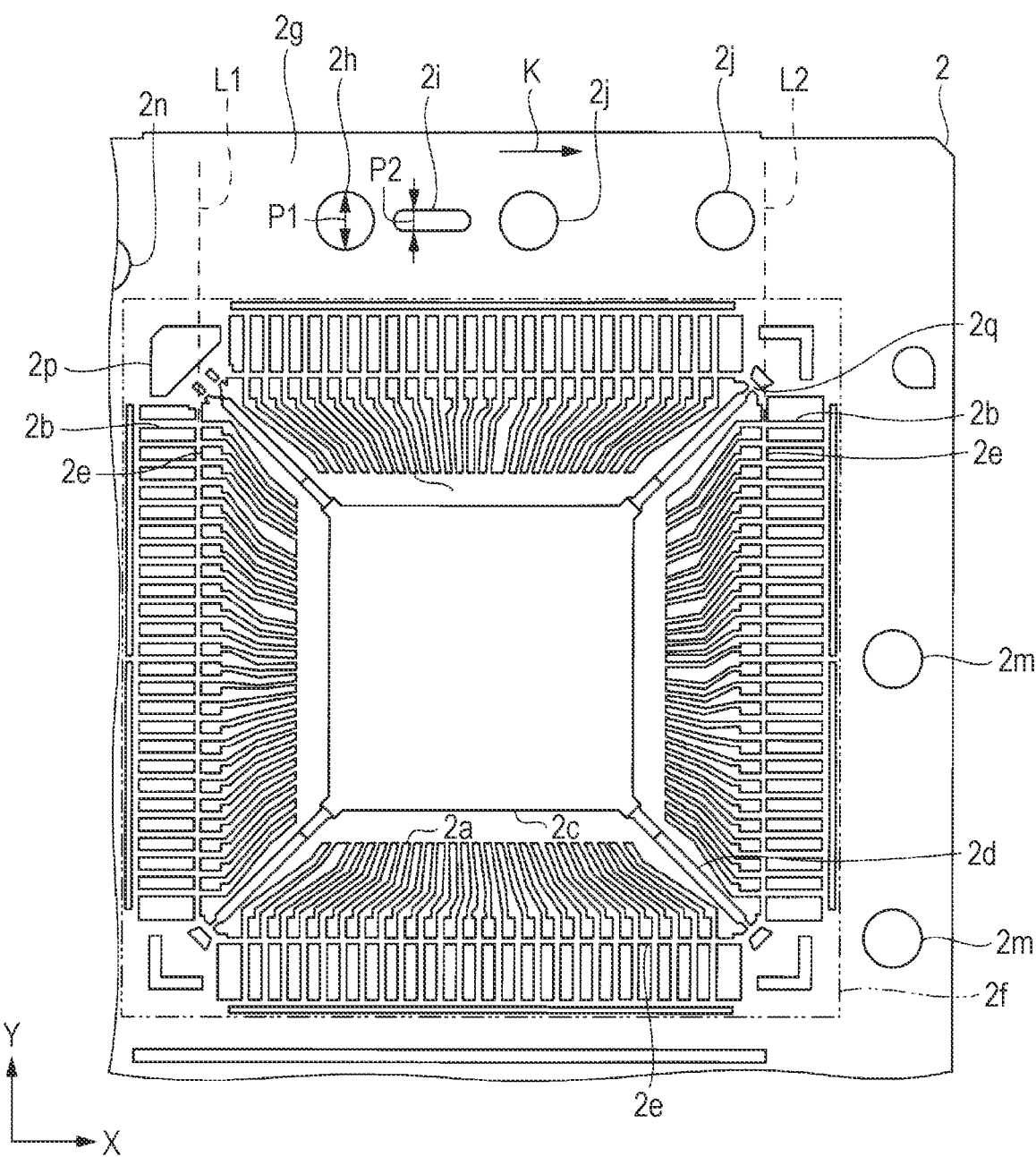
FIG. 8 is a partially-enlarged plan view showing the structure of a section B in FIG. 7.

The die pad 2c is supported by a plurality of suspension leads 2d, which will be describe later, as shown in FIG. 8, and the aforementioned leads that are not coupled to the die pad 2c are electrically coupled to the bonding pads 1c of the semiconductor chip 1 via a plurality of wires 3. The wires 3 are coupled to the bonding pads 1c and inner leads 2a, respectively, by ultrasonic wire bonding, thermocompression wire bonding, or other wire bonding.

The encapsulation body 4 has an upper face (front face) 4a situated on the same side as the main face 1a of the semiconductor chip 1 and extending along the main face 1a, a lower face (mounting face) 4b opposed to the upper face 4a, and side faces 4c situated between the upper face 4a and lower face 4b, and the encapsulation body 4 is made of encapsulating resin or other materials. The lower face 4b of the encapsulation body 4 is flush with the lower face 2cb of the die pad 2c.

The encapsulation body 4 encapsulates the die pad 2c, inner leads 2a, which are part of the leads, semiconductor chip 1, and wires 3 such that the outer leads 2b, which are the other part of the leads, project from the side faces 4c.

Specifically, each of the leads is partially buried in the encapsulation body 4, which is referred to as the inner lead 2a, and partially projects outward from a side face 4c of the encapsulation body 4, which is referred to as the outer lead 2b. Each of the leads is an integral piece including the inner lead 2a and outer lead 2b.

The inner leads 2a are coupled to the wires 3, respectively, while the outer leads 2b are bent in the shape of a gull wing outside the encapsulation body 4 and used as external coupling terminals. The surfaces of the outer leads 2b are coated with a plating film.

The encapsulation body 4 is made of, for example, thermosetting epoxy resin (encapsulating resin 14 in FIG. 21 which will be described later). The encapsulation body 4 has, as shown in FIG. 1, indentations 4d formed by pressing with an ejector pin, and an indicator mark 4e used as an index, on the upper face 4a. In the QFP 6 of this embodiment, as shown in FIG. 3, the lower face 2cb of the die pad 2c is exposed at the lower face 4b of the encapsulation body 4 (exposed-die-pad type QFP 6).

The semiconductor chip 1 includes a substrate containing silicon, and multiple interconnect layers (not shown) that are formed over an element formation face of the substrate and are thinner than the substrate.

The wires 3 are made of a material mainly containing, for example, copper (Cu) or gold (Au).

<Mold>

Figure 4:
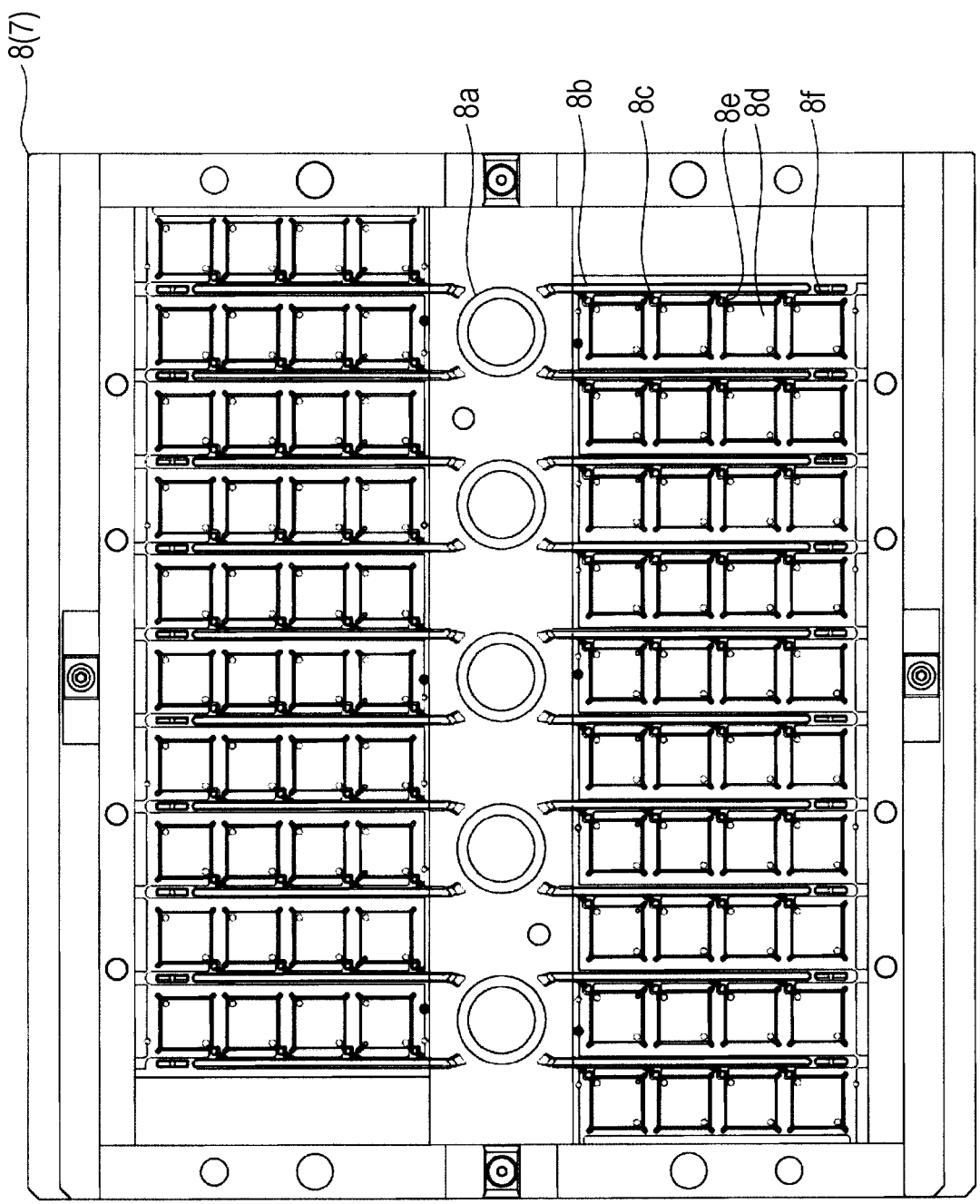
FIG. 4 is a plan view showing an example structure of a lower mold half of a mold used during assembly of the semiconductor device according to the embodiment.
Figure 5:
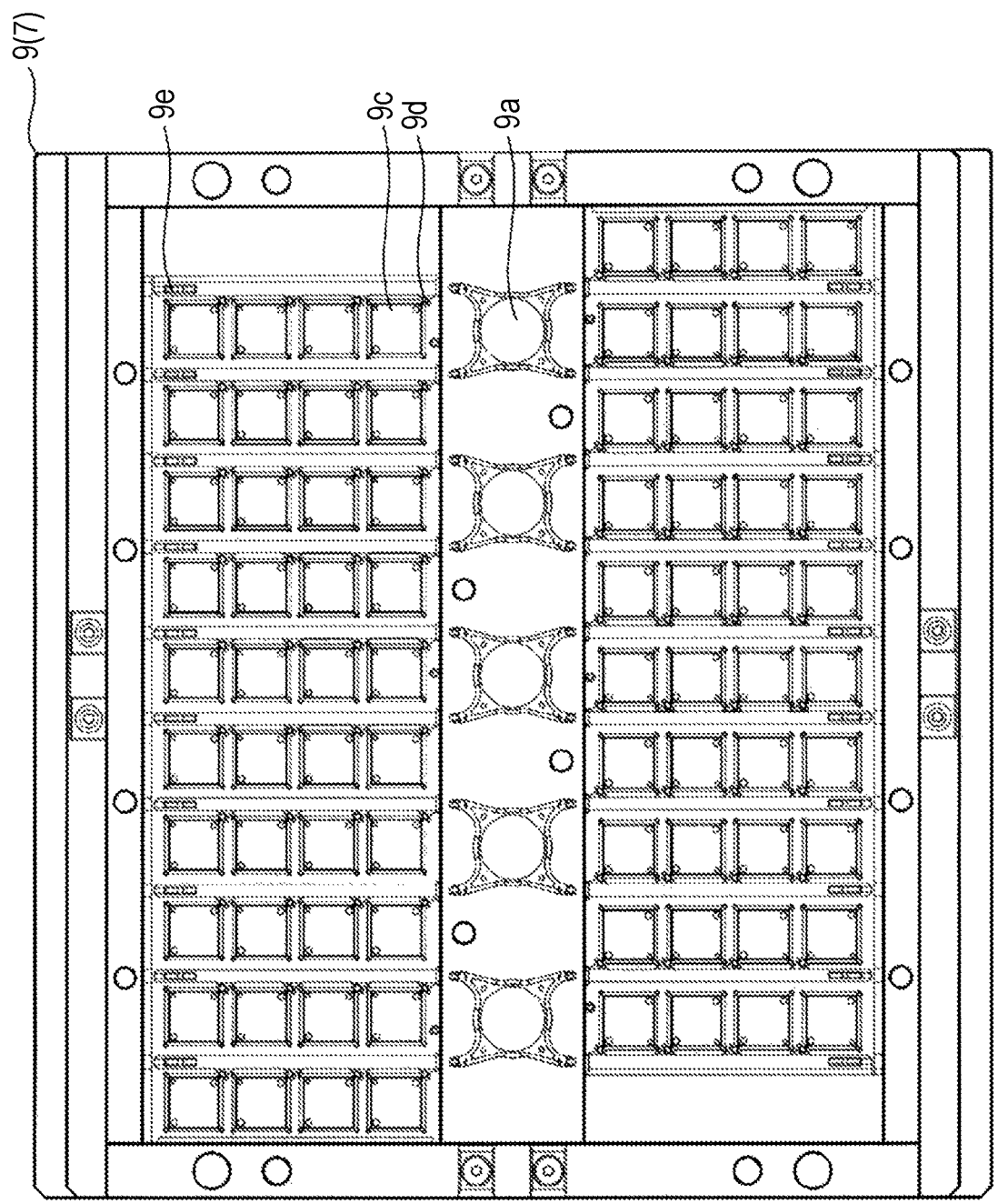
FIG. 5 is a plan view showing an example structure of an upper mold half of the mold shown in FIG. 4.

Next, description will be given about a mold used in a resin encapsulation process during assembly of the semiconductor device according to the embodiment. FIG. 4 is a plan view showing an example structure of a lower mold half of a mold used during assembly of the semiconductor device according to the embodiment, and FIG. 5 is a plan view showing an example structure of an upper mold half of the mold shown in FIG. 4.

As shown in FIG. 4, formed in a lower mold half 8 of a mold 7 are a plurality of pots 8a that are arranged in a row and each receives a resin tablet therein to serve as a resin feeder, a plurality of runners 8b serving as channels for resin, and a plurality of lower cavity halves 8d in which encapsulation bodies 4 of the QFPs 6 as shown in FIG. 1 are formed. Resin molding is performed with the mold 7 of the embodiment as follows: resin in a pot 8a is diverted in four directions to the runners 8b and poured into the cavities in the lower mold half 8 and an upper mold half 9 shown in FIG. 5 in a symmetrical manner.

The lower cavity halves 8d are arranged to match with device regions 2f, which are a plurality of product regions of a lead frame 2, which will be described later, shown in FIG. 6. Product runners 8c are formed to allow the respective cavity halves 8d to communicate with the runners 8b. In addition, at the entrances of channels to the cavity halves 8d formed are lower cavity-gate halves 8e.

The mold 7 in this embodiment has dummy cavity halves 8f formed along the runners 8b and also at the downstream side in the flow direction of resin relative to the runners 8b. In other words, the dummy cavity halves 8f serving as resin sumps are formed alongside end portions on the most downstream side of the runners 8b.

On the other hand, as shown in FIG. 5, the upper mold half 9 of the mold 7 includes a plurality of culls 9a arranged in a row to match with the pots 8a of the lower mold half 8 and serving as resin feeders, and a plurality of upper cavity halves 9c in which encapsulation bodies 4 of the QFPs 6 as shown in FIG. 1 are formed. Similar to the lower mold half 8, the cavity halves 9c are arranged to match with the device regions 2f, which are a plurality of product regions of the lead frame 2, which will be described later, shown in FIG. 6.

Thus, when the lower mold half 8 and upper mold half 9 of the mold 7 are clamped together, the cavity halves 8d are opposed to and mated with the cavity halves 9c, respectively, and each pair of the cavity halves 8d and 9c forms a cavity 10 holding a single enclosed space to form an encapsulation body 4 (see FIG. 13 described below).

Similar to the lower mold half 8, the upper mold half 9 also has upper cavity-gate halves 9d at the entrances of channels to the cavities.

The upper mold half 9 of the mold 7 in this embodiment also has dummy cavity halves 9e serving as resin sumps. The dummy cavity halves 9e of the upper mold half 9 are formed at positions corresponding to the positions of the dummy cavity halves 8f of the lower mold half 8. When the lower mold half 8 and upper mold half 9 are clamped together, the dummy cavity halves 8f are opposed to and mated with the dummy cavity halves 9e, respectively, and each pair of the dummy cavity halves 8f and 9e forms a dummy cavity 11 holding a single enclosed space serving as a resin sump (see FIG. 15 described below).

The lower mold half 8 and upper mold half 9 are configured to form orifices 12a of cavity gates (first gates) 12 when the lower and upper mold halves 8, 9 are clamped. Each of the orifices 12a serves as an entrance of the channel to a cavity 10 as shown in FIGS. 13 and 14. The lower mold half 8 and upper mold half 9 are also configured to form orifices 13a of dummy-cavity gates (second gates) 13, each serving as an entrance of the channel to the dummy cavity 11 as shown in FIGS. 15 and 16.

The orifices 13a of the dummy-cavity gates 13 are part of long narrow dummy-cavity gate holes (second holes in FIG. 8 described below) 2i formed in the lead frame 2.

Figure 16:
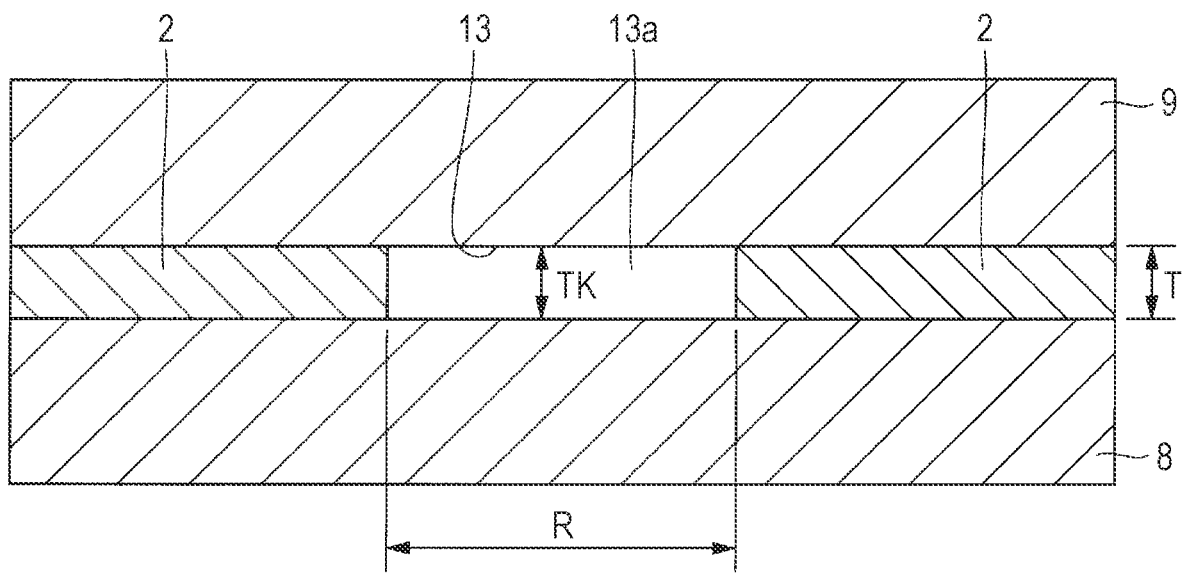
FIG. 16 is a partially-enlarged cross-sectional view showing the structure cut along a line D-D in FIG. 15.

When the lower mold half 8 and upper mold half 9 of the mold 7 according to the embodiment are clamped together in a resin molding process, as shown in FIGS. 14 and 16 described below, the orifices 12a of the cavity gates 12 are larger in size than the orifices 13a of the dummy-cavity gates 13 from the time when resin starts flowing into the mold to the time when encapsulation bodies 4 are formed in the mold. The size of the orifices 12a and orifices 13a will be described later.

<Lead Frame>

Figure 6:
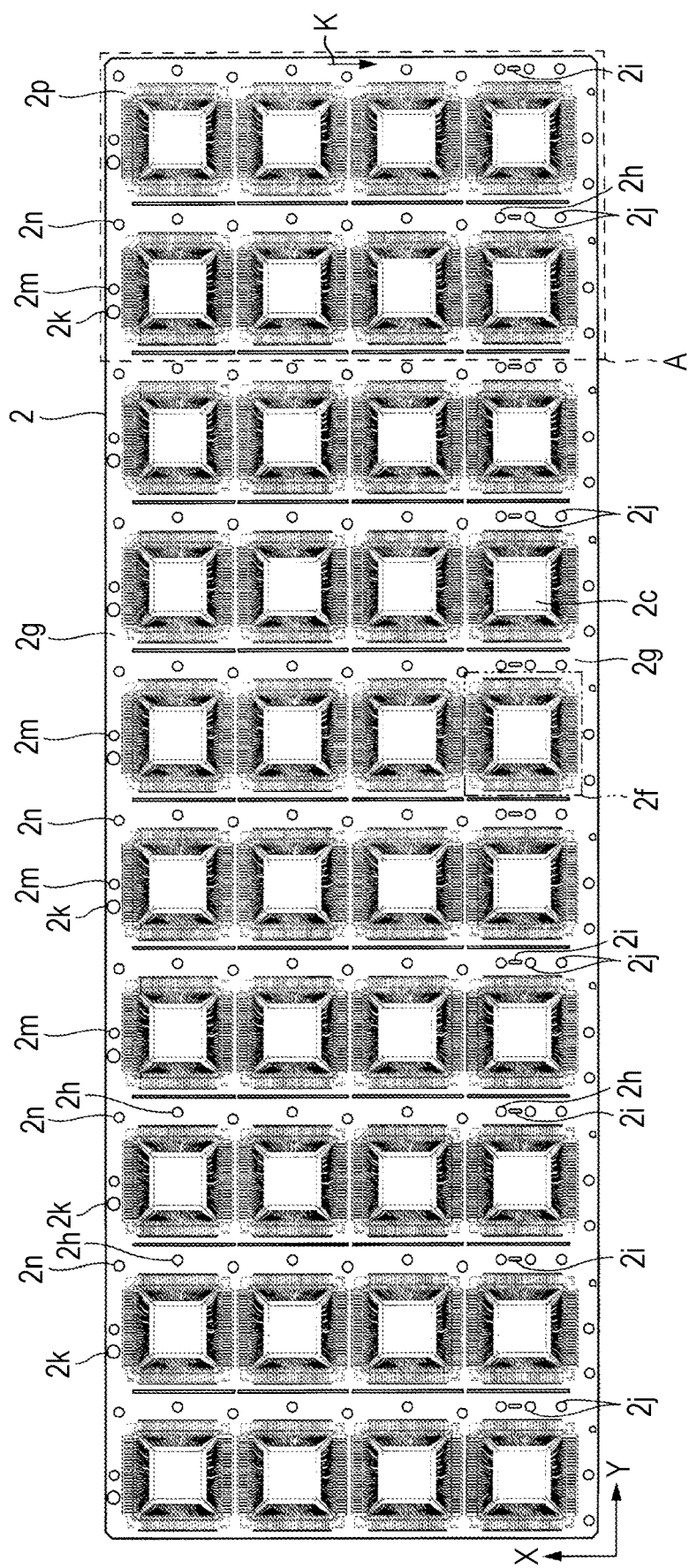
FIG. 6 is a plan view showing an example structure of a lead frame used during assembly of the semiconductor device according to the embodiment.
Figure 7:
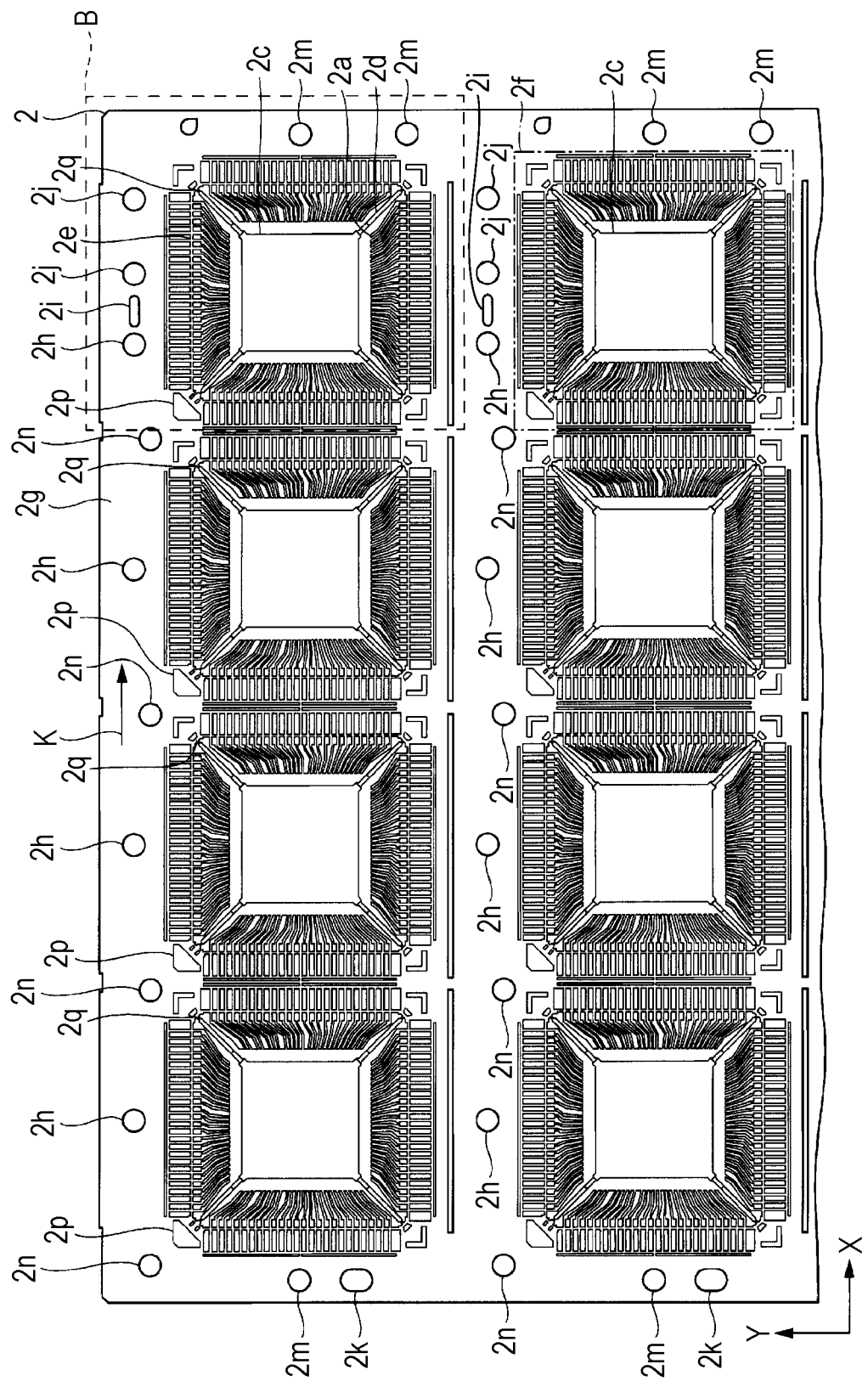
FIG. 7 is a partially-enlarged plan view showing the structure of a section A in FIG. 6.

FIG. 6 is a plan view showing an example structure of a lead frame used during assembly of the semiconductor device according to the embodiment, FIG. 7 is a partially-enlarged plan view showing the structure of a section A in FIG. 6, and FIG. 8 is a partially-enlarged plan view showing the structure of a section B in FIG. 7.

The lead frame 2 in FIG. 6 is a frame member in the shape of a thin sheet, having a plurality of device regions 2f laid out in a matrix, each of which forms a QFP 6 shown in FIG. 1. The lead frame 2 used to assemble the QFP 6 in this embodiment is a frame member being capable of providing, as an example, 40 QFPs (4×10=40) at a time.

As shown in FIG. 7, the lead frame 2 includes a plurality of device regions 2f each having a plurality of leads, dam bars 2e supporting the leads, and a die pad 2c, and a frame section 2g arranged around the device regions 2f and including a plurality of runner ejection holes (first holes) 2h formed for each of the device regions 2f.

As shown in FIG. 6, the frame section 2g of the lead frame 2 has locating holes 2k and frame feeding holes 2m equidistantly formed with the same pitch as the device regions 2f which are product sections. Both the holes are used to transfer the lead frame 2 (also referred to as a frame structure) in the middle of the assembling process. In addition, the frame section 2g also has a plurality of gate runner ejection holes 2n each formed at a position corresponding to a corner of the gate for the device region 2f.

Specifically, as shown in FIG. 7, where the direction in which the runner ejection holes 2h are aligned is defined as an X-direction (first direction), while the direction perpendicular to the X-direction is defined as a Y-direction (second direction), each of the device regions 2f includes a gate resin sump hole 2p and a suspension-lead base end 2q arranged at a corner of the corresponding device region 2f, the corner being opposed to the gate resin sump hole 2p in the X-direction. Where the direction proceeding from the gate resin sump hole 2p to the suspension-lead base end 2q is defined as a third direction K, the aforementioned dummy-cavity gate holes (second holes) 2i are formed in the frame section 2g, near a device regions 2f located closest to an edge in the third direction K (in a downstream direction of resin flowing during resin molding) among the device regions 2f aligned in the X-direction.

As shown in FIG. 8, the dummy-cavity gate hole 2i is located between extension lines L1 and L2 each extending from two opposed dam bars 2e provided along the Y-direction, and also is located beyond the runner ejection hole 2h, which is located closest to the edge in the third direction K among the runner ejection holes 2h aligned in the X-direction, in the third direction K. In other words, the dummy-cavity gate hole 2i is formed next to the runner ejection hole 2h that is closest to the edge in the third direction K, or at an end portion of the runner.

In addition, as shown in FIG. 8, the width P2 of the dummy-cavity gate hole 2i in the Y-direction is smaller than the width P1 of the runner ejection hole 2h in the Y-direction (P2<P1).

In the frame section 2g adjacent to the device region 2f located closest to the edge in the third direction K among the device regions 2f, a resin retaining hole 2j, which is a third hole for retaining resin, is formed still closer to the edge in the third direction K than the dummy-cavity gate hole 2i. It is preferable to form a plurality of (e.g. two in this embodiment) the resin retaining holes 2j in the third direction K along the dummy-cavity gate hole 2i; however, at least one resin retaining hole 2j may be sufficient.

<Assembly of Semiconductor Device>

Figure 9:
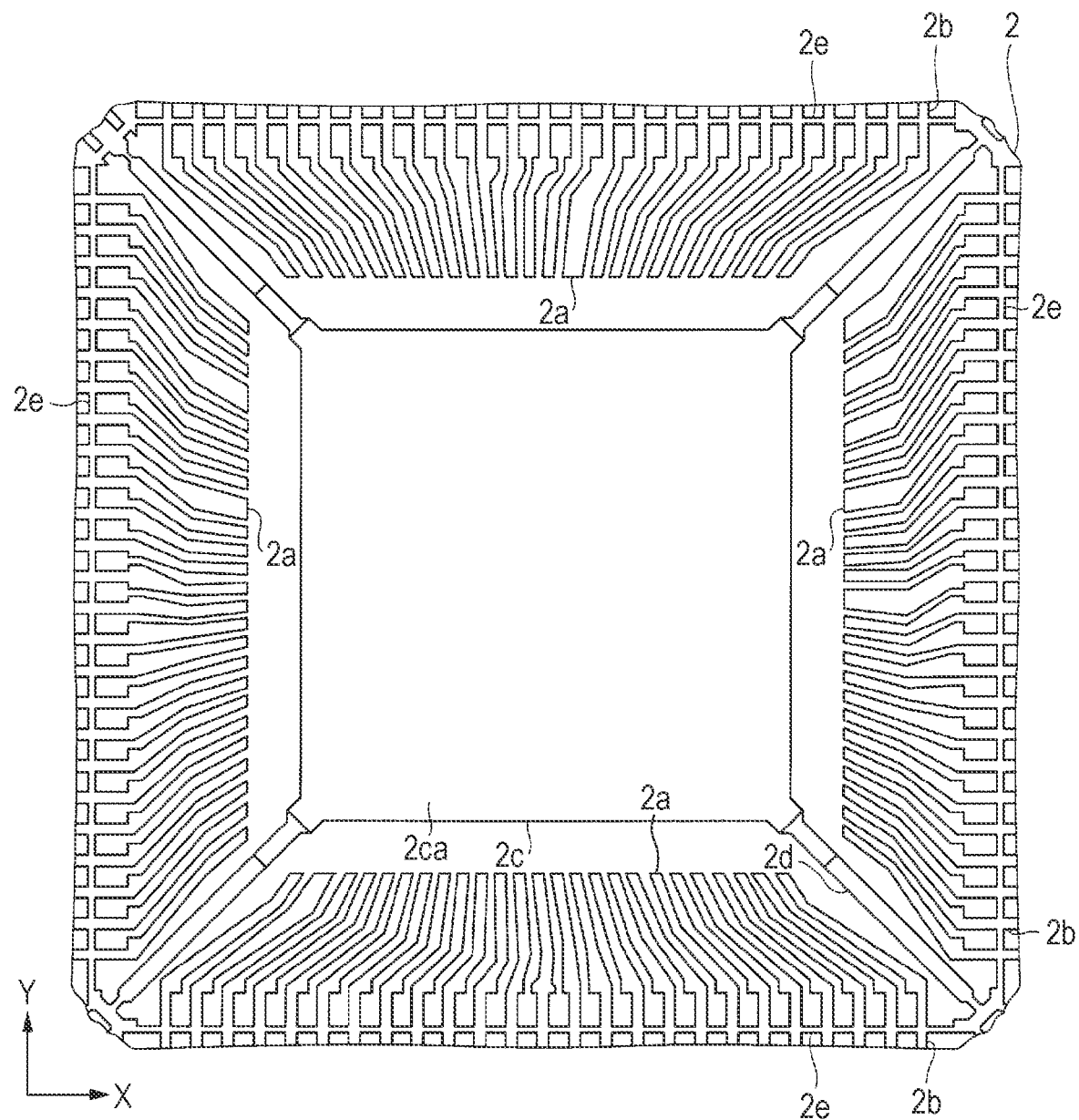
FIG. 9 is a partially-enlarged plan view showing an example structure of a device region of the lead frame shown in FIG. 6.
Figure 10:
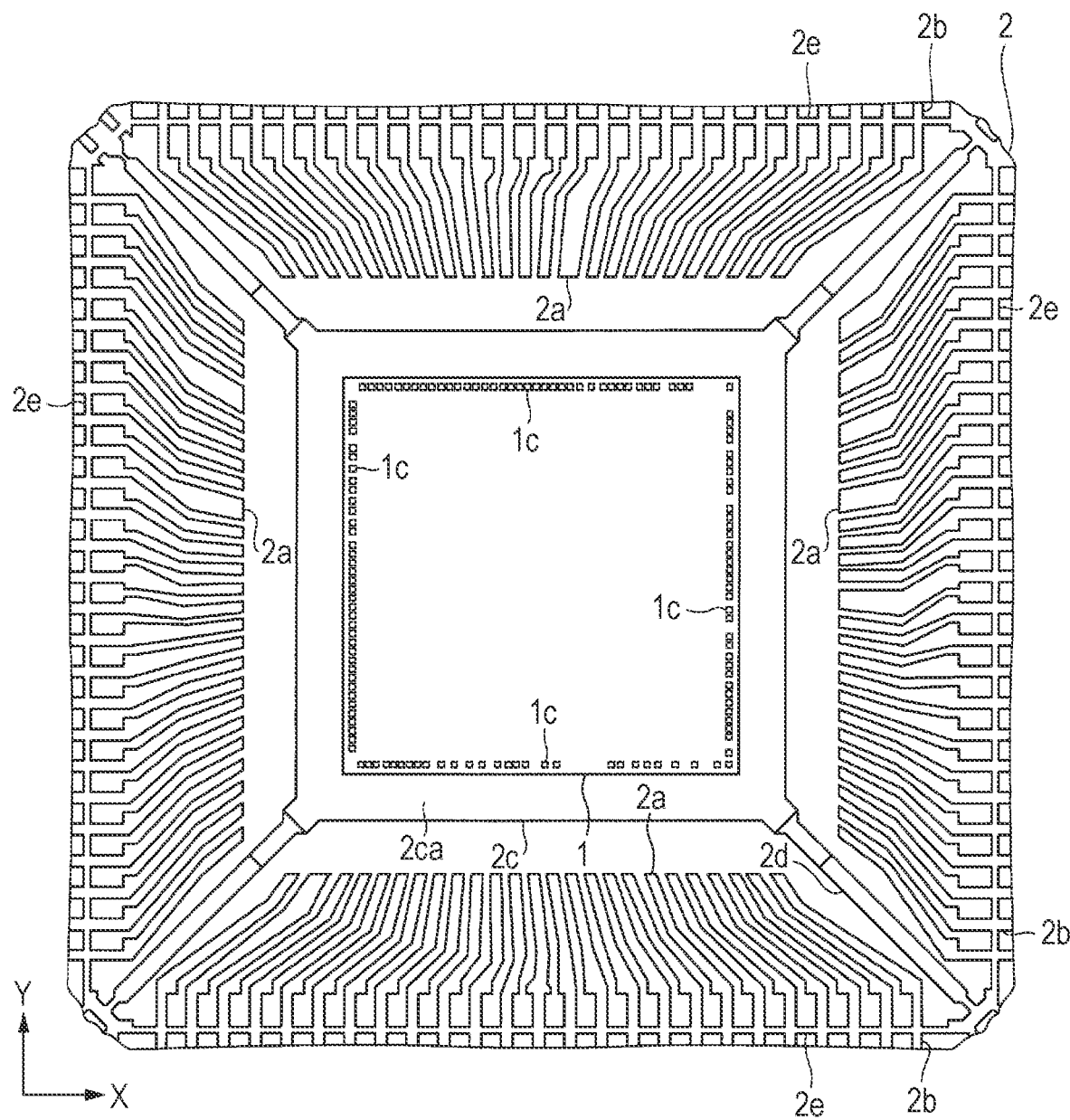
FIG. 10 is a partially-enlarged plan view showing an example structure of the device region after a die-bonding process during assembly of the semiconductor device according to the embodiment.
Figure 11:
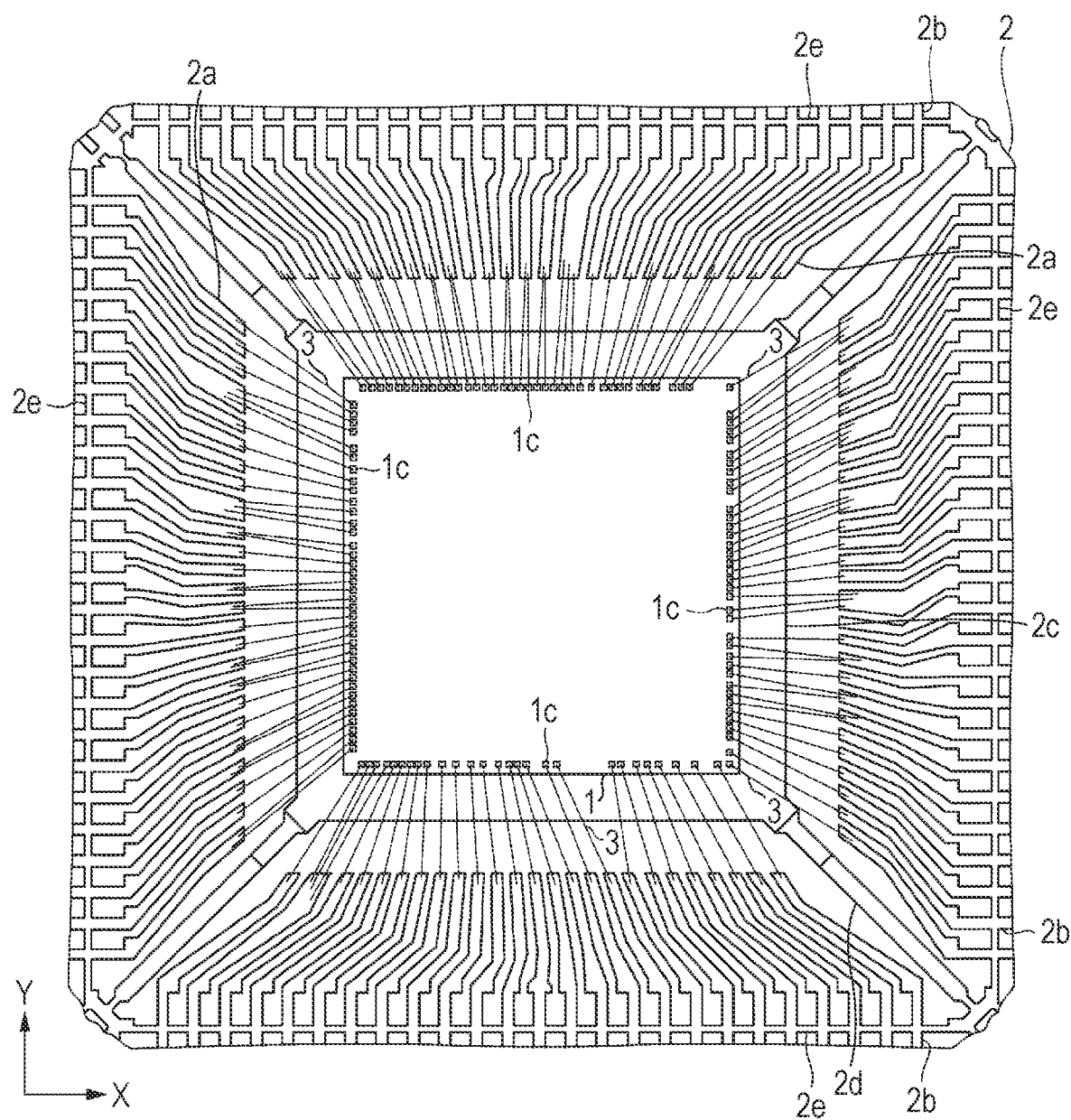
FIG. 11 is a partially-enlarged plan view showing an example structure of the device region after a wire-bonding process during assembly of the semiconductor device according to the embodiment.
Figure 12:
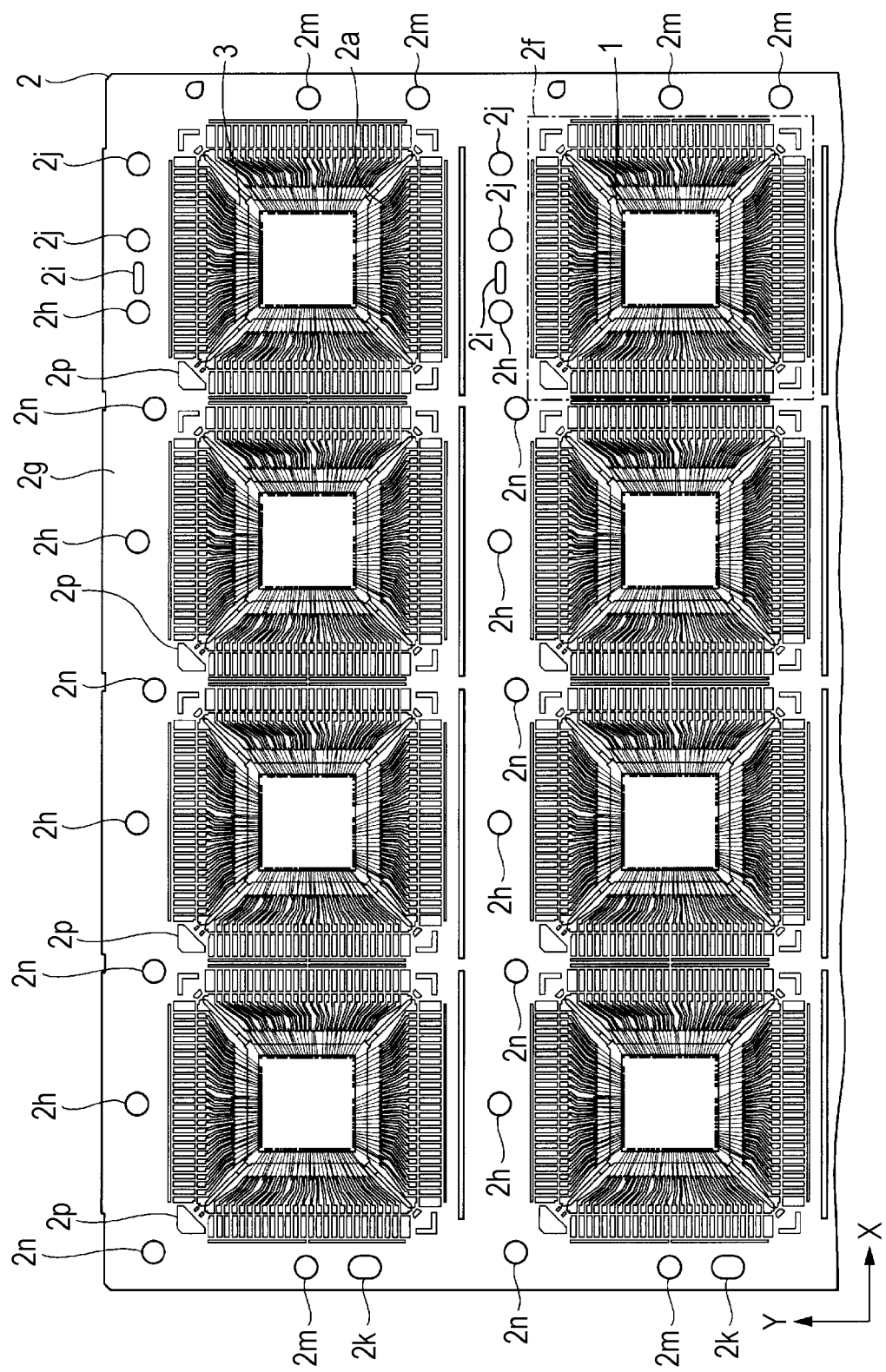
FIG. 12 is a partial plan view showing an example structure of a frame structure after the wire-bonding process shown in FIG. 11.

FIG. 9 is a partially-enlarged plan view showing an example structure of a device region of the lead frame shown in FIG. 6, and FIG. 10 is a partially-enlarged plan view showing the example structure of the device region after a die-bonding process during assembly of the semiconductor device according to the embodiment. FIG. 11 is a partially-enlarged plan view showing the example structure of the device region after a wire-bonding process during assembly of the semiconductor device according to the embodiment, and FIG. 12 is a partial plan view showing an example structure of the frame structure after the wire-bonding process in FIG. 11.

To describe the assembly of the semiconductor device (QFP 6) in this embodiment, only one of the device regions 2f is picked up for the sake of clarity.

1. Provision of Lead Frame

A lead frame shown in FIGS. 6 to 8 is provided. As described above, the lead frame 2 in the shape of a thin sheet has a plurality of device regions 2f laid out in a matrix as viewed in plan view. Each of the device regions 2f includes, as shown in FIG. 9, a die pad 2c, a plurality of suspension leads 2d supporting the die pad 2c, a plurality of leads composed of inner leads 2a and outer leads 2b arranged along the periphery of the die pad 2c, and dam bars 2e supporting the individual inner leads 2a.

The lead frame 2 also has, as shown in FIG. 8, a frame section 2g around the device regions 2f. In a part of the frame section 2g near the device region 2f closest to an edge in the third direction K among the device regions 2f, a runner ejection hole 2h, a dummy-cavity gate hole 2i, and two resin retaining holes 2j are formed in this order in the X-direction.

2. Die Bonding

After the lead frame 2 is provided, die bonding is performed. Specifically, as shown in FIG. 10, a semiconductor chip 1 is mounted (placed) over the upper face 2ca of the die pad 2c of the lead frame 2. In this die placement, as shown in FIG. 3, the semiconductor chip 1 is mounted over the upper face 2ca of the die pad 2c with a die bonding material 5 interposed therebetween such that the back face 1b of the semiconductor chip 1 faces the upper face 2ca of the die pad 2c of the lead frame 2.

3. Wire Bonding

After die bonding, wire bonding is performed shown in FIG. 11. Specifically, a plurality of bonding pads 1c of the semiconductor chip 1 are electrically coupled to the inner leads 2a with electrically conductive wires 3, respectively. The wires 3 are made of a material mainly containing, for example, copper (Cu) or gold (Au). FIG. 12 shows a plurality of device regions 2f that have been wire bonded completely.

4. Resin Molding

After wire bonding, resin molding is performed. This embodiment describes resin molding with a mold 7 used for transfer molding as shown in FIGS. 4 and 5. The mold 7 has a plurality of cavity halves 8d, 9c and dummy cavity halves 8f, 9e. In addition, the mold 7 has runners 8b communicating with the cavity halves 8d, 9c and dummy cavity halves 8f, 9e. The mold 7 is configured such that resin loaded in a pot 8a is diverted in four directions to the runners 8b and poured into the cavities in a lower mold half 8 and an upper mold half 9 shown in FIG. 5 in asymmetrical manner.

First, a lead frame 2 is placed over the lower mold half 8 of the mold 7 such that the device regions 2f match against the cavity halves 8d, 9c, respectively.

After the placement of the lead frame 2, a resin tablet is loaded in the pots 8a, and then the upper mold half 9 and lower mold half 8 are clamped together at a predetermined pressure. The resin (encapsulating resin 14 shown in FIG. 22 described below) that is heated in the pots 8a at a predetermined temperature to be liquefied is flown into the cavity halves 8d, 9c through the runners 8b to encapsulate part of the lead frame 2 and the entire semiconductor chips 1, thereby forming the encapsulation body 4 as shown in FIG. 1.

Figure 13:
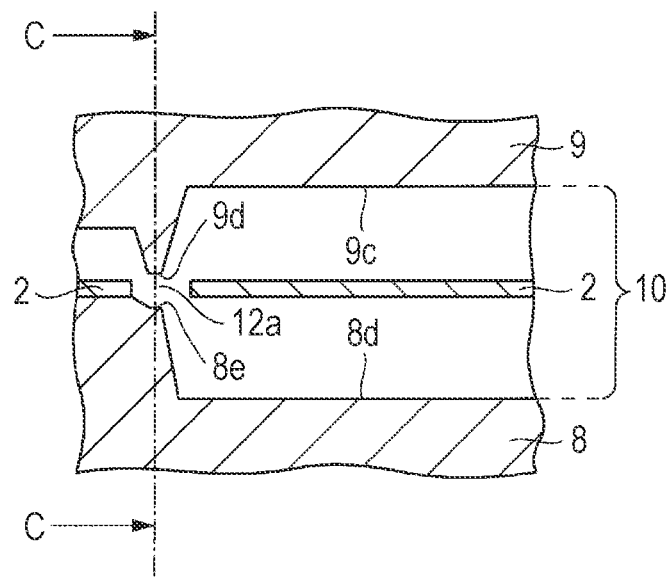
FIG. 13 is a partially-enlarged cross-sectional view showing an example shape of a cavity gate in a mold clamped during assembly of the semiconductor device according to the embodiment.
Figure 14:
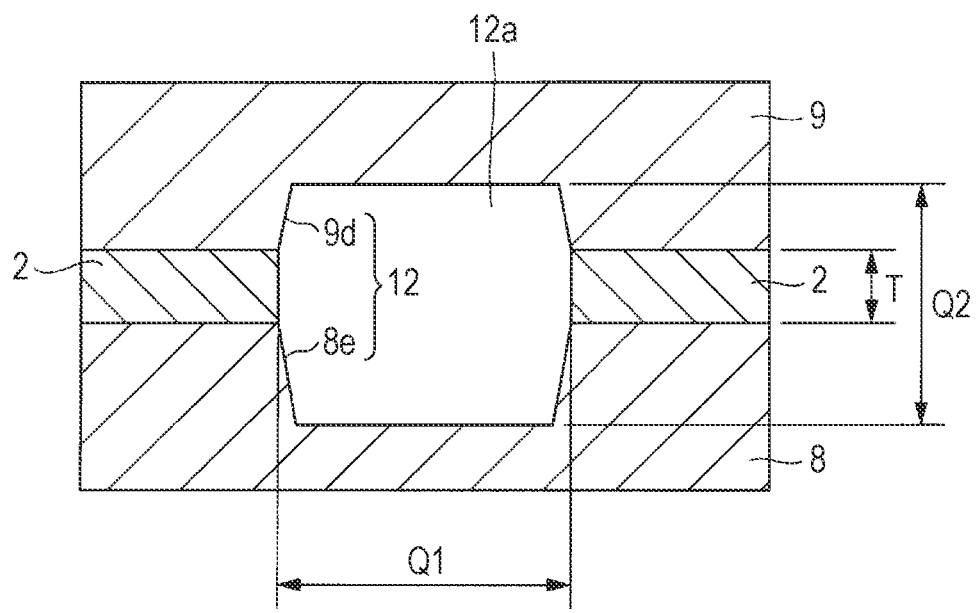
FIG. 14 is a partially-enlarged cross-sectional view showing the structure cut along a line C-C in FIG. 13.
Figure 15:
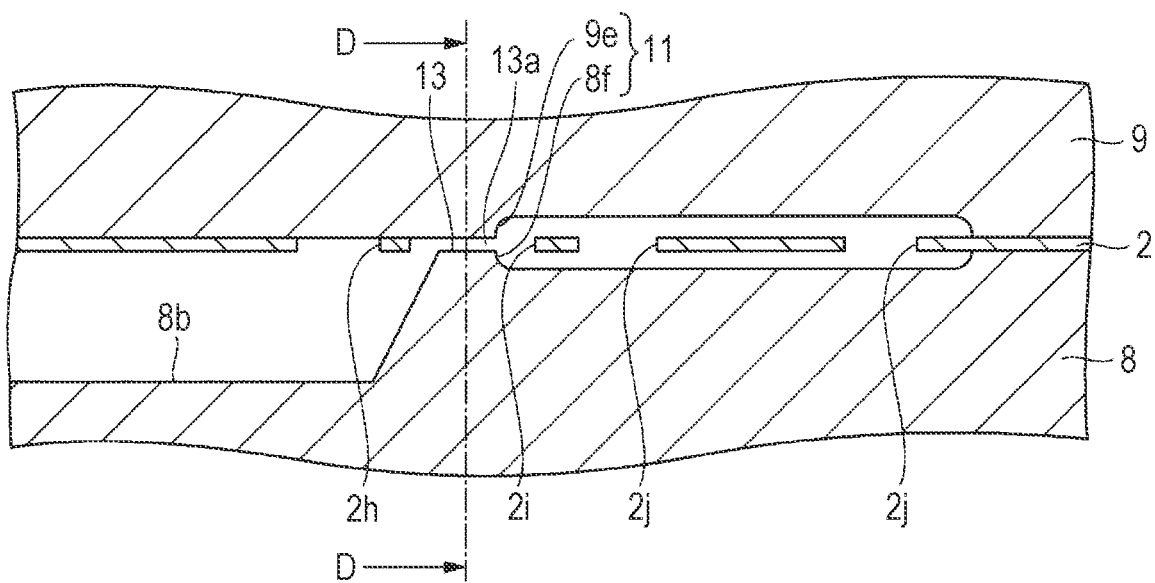
FIG. 15 is a partially-enlarged cross-sectional view showing an example shape of a runner and a dummy cavity in the mold clamped during assembly of the semiconductor device according to the embodiment.

FIG. 13 is a partially-enlarged cross-sectional view showing an example shape of a cavity gate when the mold is clamped during assembly of the semiconductor device of the embodiment, and FIG. 14 is a partially-enlarged cross-sectional view showing the structure cut along a line C-C in FIG. 13. FIG. 15 is a partially-enlarged cross-sectional view of an example shape of a runner and dummy cavity when the mold is clamped during assembly of the semiconductor device of the embodiment, and FIG. 16 is a partially-enlarged cross-sectional view showing the structure cut along a line D-D in FIG. 15.

In this embodiment, the mold 7 with the upper mold half 9 and lower mold half 8 clamped together has a plurality of cavity gates (first gates) 12 allowing the cavity halves 8d, 9c to communicate with the runners 8b shown in FIG. 14, and dummy-cavity gates (second gates) 13 allowing the dummy cavity halves 8f, 9e to communicate with the runners 8b shown in FIG. 15.

From the time when the resin (encapsulating resin 14 in FIG. 21) starts flowing into the mold 7 to the time when an encapsulation body 4 is formed in the mold 7, the orifice 12a of each cavity gate 12 shown in FIG. 14 is larger in size than the orifice 13a of each dummy-cavity gate 13 shown in FIG. 16.

As shown in FIG. 14, the size of the orifice 12a of the cavity gate 12, or the opening area of the cavity gate 12 is slightly smaller than the area expressed by Q1×Q2. For example, Q1=0.5 mm, and Q2=0.425 mm. On the other hand, the size of the orifice 13a of the dummy-cavity gate 13 shown in FIG. 16, or the opening area of the dummy-cavity gate 13 is expressed by R×T. For example, R=0.6 mm and T=0.125 mm. This shows that the orifice 12a of the cavity gate 12 has an opening area significantly larger than the opening area of the orifice 13a of the dummy-cavity gate 13.

The orifice 13a of the dummy-cavity gate 13 is a part of the dummy-cavity gate hole 2i formed in the frame section 2g of the lead frame 2. Specifically, as shown in FIG. 16, the orifice 13a of the dummy-cavity gate 13 has a height TK which is equal to the thickness T of the lead frame 2 (T in FIG. 16).

In this embodiment, as shown in FIG. 15, when the upper mold half 9 and lower mold half 8 of the mold 7 are clamped with the lead frame 2 placed therebetween, the dummy cavity halves 8f, 9e are located over the frame section 2g of the lead frame 2 shown in FIG. 12. Simultaneously, the dummy cavity halves 8f, 9e are located on the back and front face sides, respectively, of the lead frame 2. Specifically, the dummy cavity half 9e is located on the front face side of the lead frame 2, while the dummy cavity half 8f is located on the back face side of the lead frame 2, and the dummy cavity half 9e and dummy cavity half 8f make up a single dummy cavity 11.

Furthermore, the dummy cavity 11 is located across the dummy-cavity gate hole 2i and two resin retaining holes 2j in the frame section 2g of the lead frame 2. Specifically, an end portion of the dummy cavity 11, which is on the upstream side opposite to the direction in which the resin flows, is arranged so as to be laid over a part of the long narrow dummy-cavity gate hole 2i. The runner 8b is also arranged so as to be laid over an opposite part of the long narrow dummy-cavity gate hole 2i. Thus, the space in the runner 8b communicates with the space in the dummy cavity 11 through the dummy-cavity gate hole 2i.

In a state where the above-described relationship between the mold 7 and lead frame 2 is established, liquefied resin (encapsulating resin 14 in FIG. 22 described below) is fed to the cavities 10 through the runners 8b.

Figure 17:
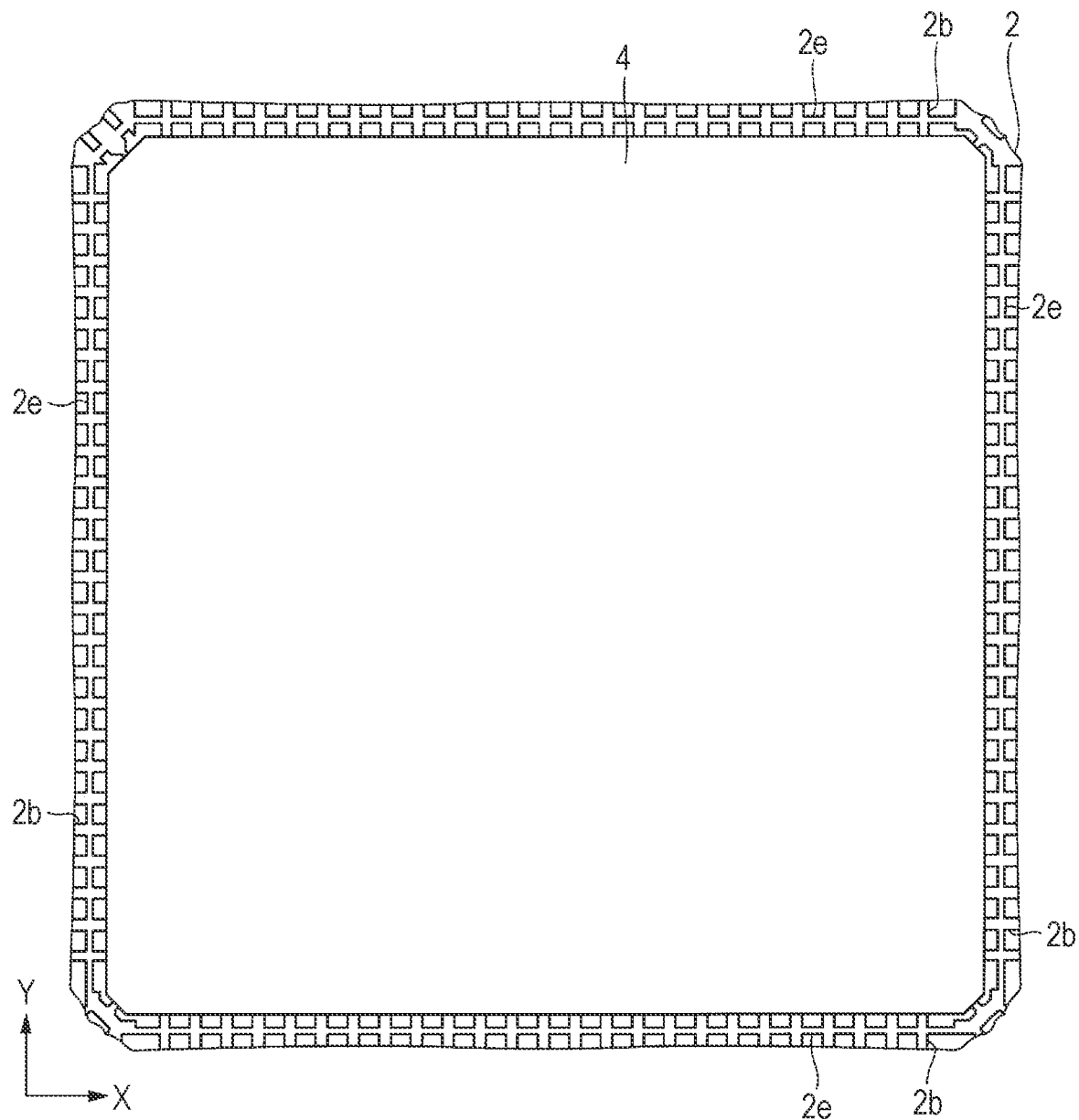
FIG. 17 is a partially-enlarged plan view showing an example structure of the semiconductor device according to the embodiment after a resin molding process in the assembly.
Figure 18:
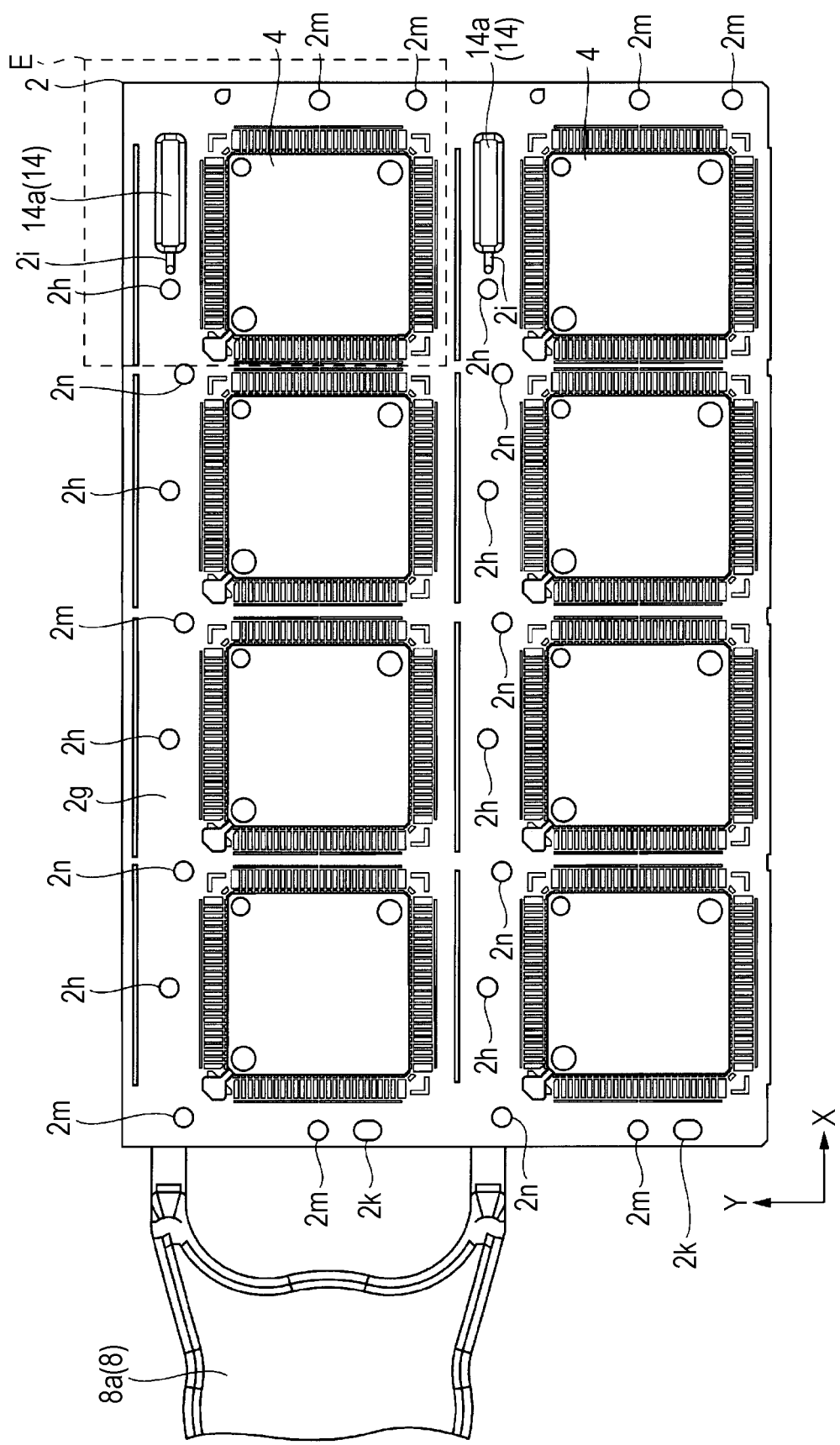
FIG. 18 is a partial plan view showing an example structure of the frame structure in a demolding process during assembly of the semiconductor device according to the embodiment.
Figure 19:
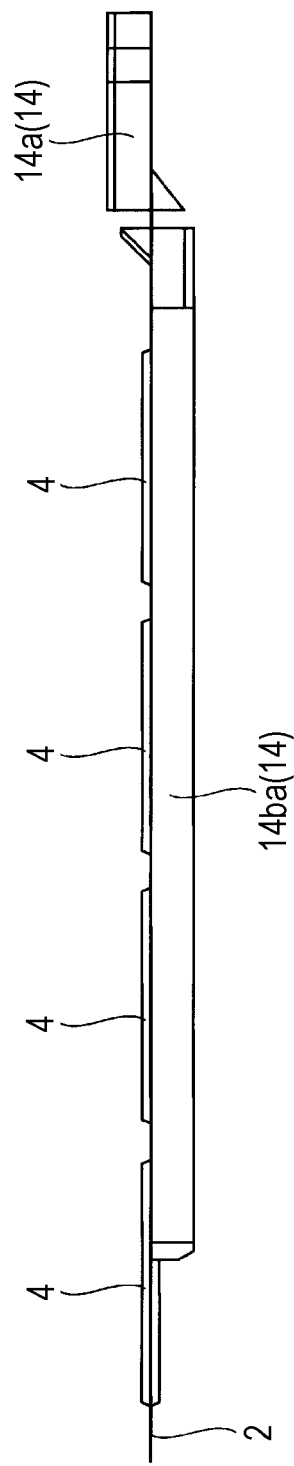
FIG. 19 is a partial side view showing the example structure of the frame structure shown in FIG. 18.
Figure 20:
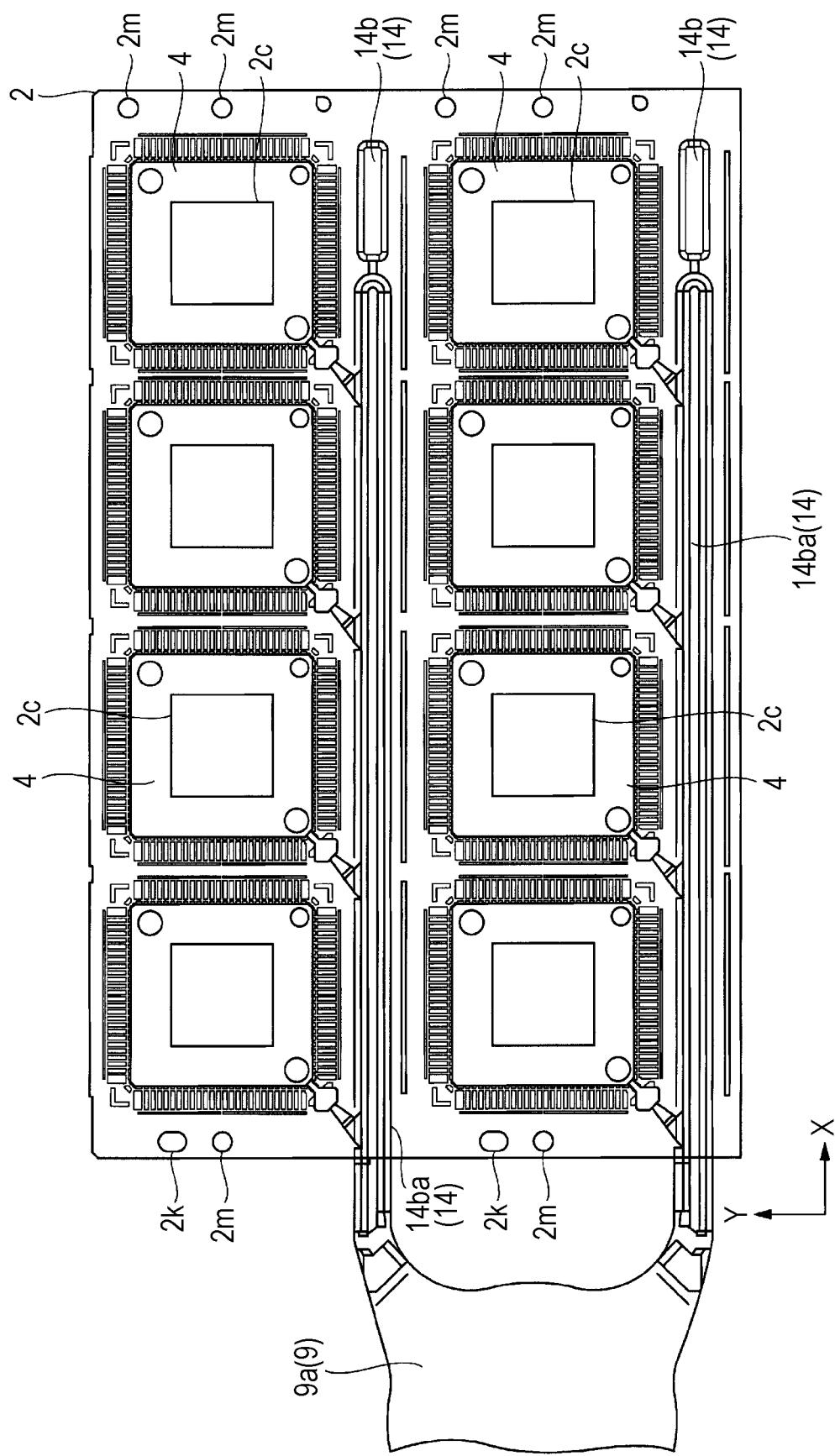
FIG. 20 is a partial back view showing the example structure of the frame structure shown in FIG. 18.
Figure 23:
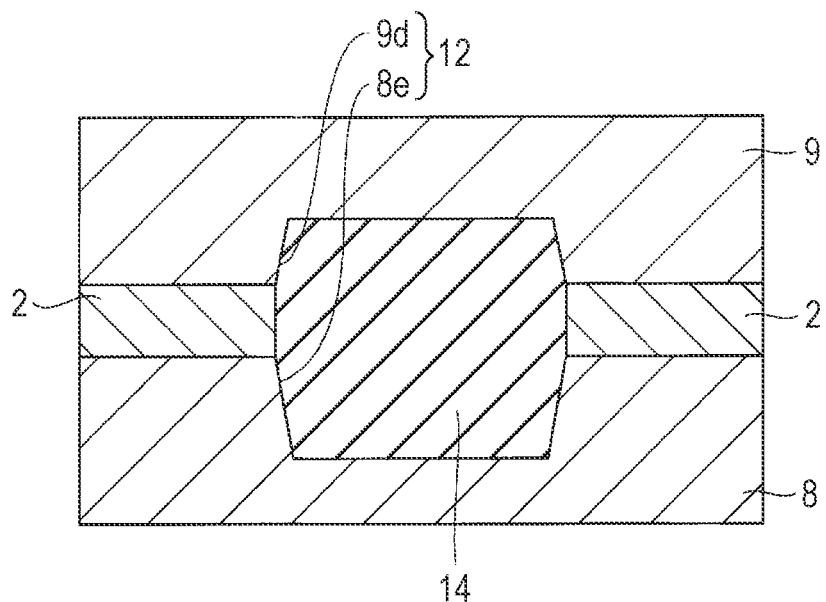
FIG. 23 is a partial cross-sectional view showing the structure cut along a line G-G in FIG. 21.
Figure 24:
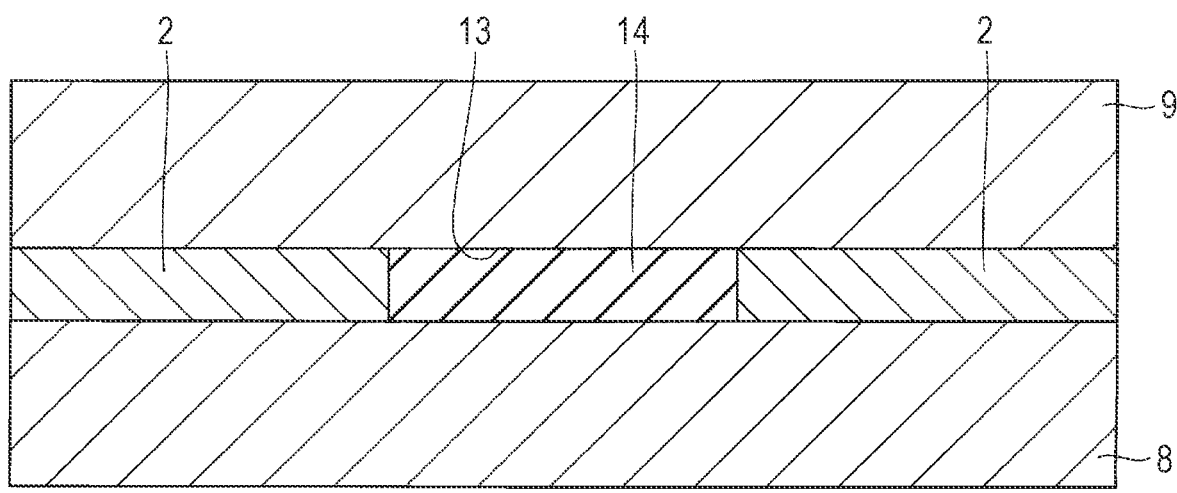
FIG. 24 is a partial cross-sectional view showing the structure cut along a line H-H in FIG. 21.

FIG. 17 is a partially-enlarged plan view showing an example structure of the semiconductor device of the embodiment after resin molding during assembly, FIG. 18 is a partial plan view showing an example structure of a frame structure in a demolding process during assembly of the semiconductor device of the embodiment, FIG. 19 is a partial side view showing the example structure of the frame structure shown in FIG. 18, and FIG. 20 is a partial back view showing the example structure of the frame structure in FIG. 18. Furthermore, FIG. 21 is a partially-enlarged plan view showing the structure of a section E in FIG. 18, FIG. 22 is a partial cross-sectional view showing the structure cut along a line F-F in FIG. 21, FIG. 23 is a partial cross-sectional view showing the structure cut along a line G-G in FIG. 21, and FIG. 24 is a partial cross-sectional view showing the structure cut along a line H-H in FIG. 21.

As described above, the resin is fed to each of the product cavities 10 (see FIG. 13). A description will be given here about the resin flow in the mold 7 in this embodiment.

Figure 21:
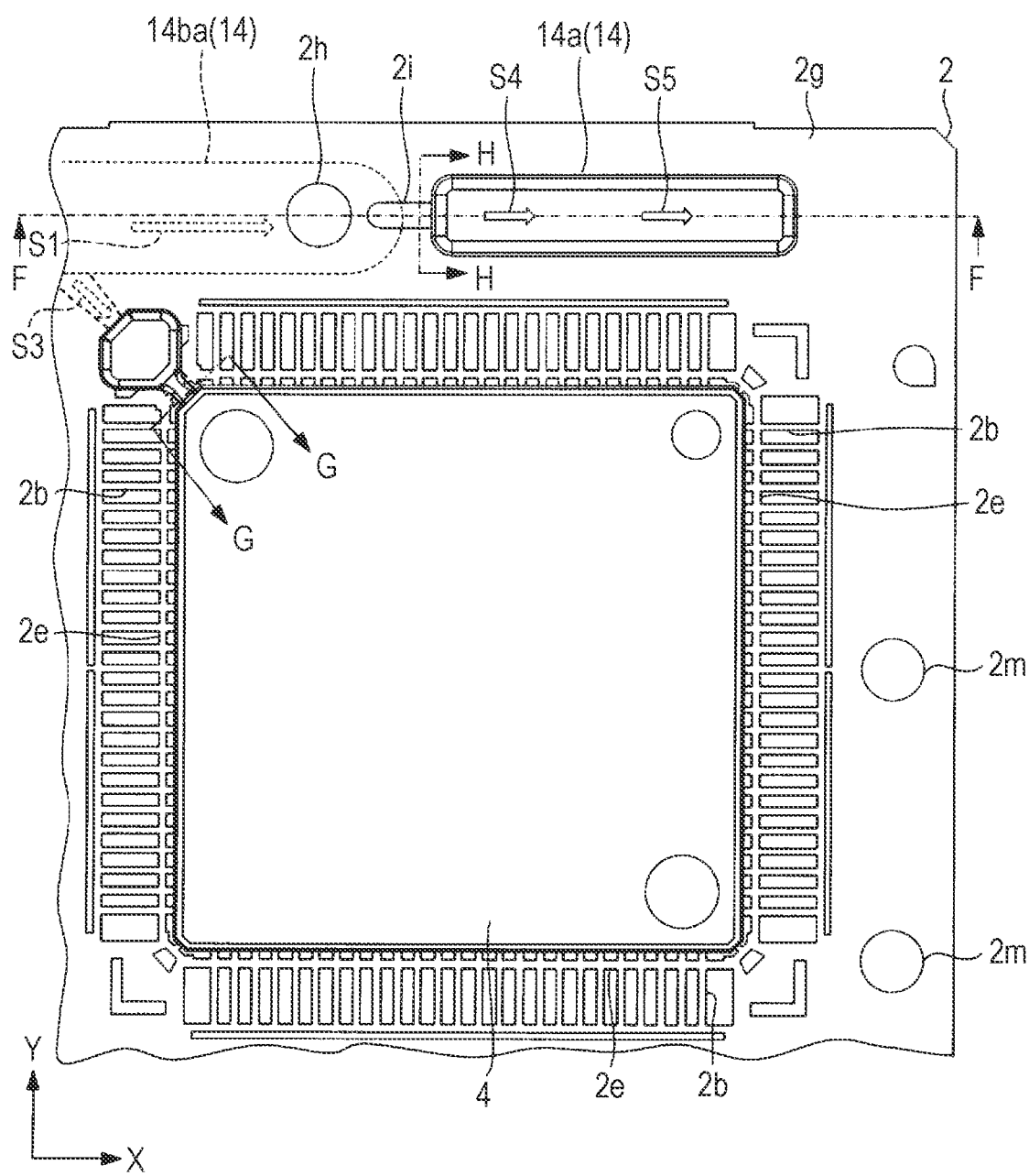
FIG. 21 is a partially-enlarged plan view showing the structure of a section E in FIG. 18.
Figure 22:
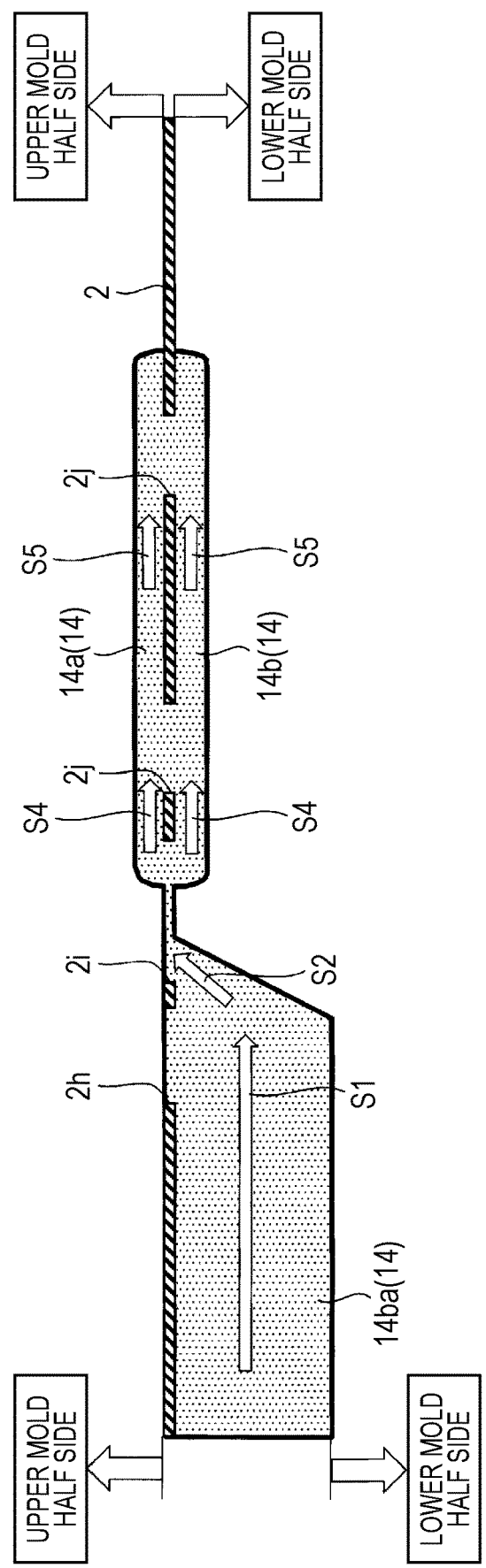
FIG. 22 is a partial cross-sectional view showing the structure cut along a line F-F in FIG. 21.

In the mold 7 of the embodiment, as shown in FIGS. 21 and 22, the cross-sectional area of the runner 8b in FIG. 4 is significantly larger than the cross-sectional area of the orifice 12a of the cavity gate 12 (see FIG. 14) and the orifice 13a of the dummy-cavity gate 13 (gate formed by utilizing the thickness of the lead frame 2) (see FIG. 16). Therefore, the flow resistance of the resin (encapsulating resin 14) flowing through the runner 8b along an arrow S1 in FIG. 21 becomes low, and the encapsulating resin 14 is charged along an arrow S2 in FIG. 22 until the encapsulating resin 14 reaches the dummy-cavity gate hole 2i of the dummy-cavity gate 13.

Since the orifice 12a of the cavity gate 12 is larger than the orifice 13a of the dummy-cavity gate 13, the flow resistance of the resin at the cavity gate 12 is low. Thus, the encapsulating resin 14 flows along an arrow S3 shown in FIG. 21, and passes through the orifice 12a (see FIG. 14) of the cavity gate 12 as shown in FIG. 23, thereby starting resin injection into the cavity 10 (see FIG. 13). Because the amount of the encapsulating resin 14 is larger than the capacity of the dummy cavity 11, a slight amount of the encapsulating resin 14 passes through the orifice 13a of the dummy-cavity gate 13 (see FIG. 16) shown in FIG. 24 before the resin injection into the cavity 10 is completed, and fills part of the dummy cavity 11 (see FIG. 15) along an arrow S4 shown in FIG. 22.

However, the gate size (size of the orifice 13a) of the dummy-cavity gate 13 is smaller than the gate size (size of the orifice 12a) of the cavity gate 12, and therefore the resin completely fills up the dummy cavity 11 (arrow S5) after the resin injection into the cavity 10 is completed.

The dummy cavity 11 is filled up by feeding the encapsulating resin 14 into both the dummy cavity half 9e arranged on the front face side of the frame section 2g of the lead frame 2 and the dummy cavity half 8f arranged on the back face side of the frame section 2g of the lead frame 2.

The size of the dummy-cavity gate hole 2i of the lead frame 2 can be adjusted appropriately in accordance with the encapsulating resin 14 and the capacity of the dummy cavity 11, but the adjustment should be made within the range that the cross-sectional area of the dummy-cavity gate 13 (area of the orifice 13a) is smaller than the cross-sectional area of the cavity gate 12 (area of the orifice 12a). In this case, the adjustment can be readily and inexpensively optimized by widening or narrowing the dummy-cavity gate hole 2i of the lead frame 2 in a plan view rather than adjusting the mold 7.

After the cavity 10 is completely filled up with the resin, the encapsulating resin 14, which is a thermosetting epoxy resin, is cured while the resin injection pressure is maintained. Thus, the curing process forms an encapsulation body 4, as shown in FIG. 17, in each of the device regions 2f of the lead frame 2.

Subsequently, the upper mold half 9 and lower mold half 8 are separated from each other for demolding. During demolding, stress applied on the interior of the products may cause peeling of resin from the lead frame 2, removal of the mounted semiconductor chip 1 from the resin, and cracks in the semiconductor chip 1. In order to prevent the problems from happening, four points corresponding to four indentations 4d (see FIG. 1) in total provided on front and back faces of the encapsulation body 4 are pushed to demold the encapsulation body 4 (or open the mold 7) using pins.

After demolding, the lead frame 2 is taken out from the mold 7.

At this moment, as shown from FIGS. 18 to 20, third resin 14ba formed in the runner 8b and resin formed in the product runner 8c are arranged only on the back face side (bottom face side) of the lead frame 2. Therefore, the resin molded in the runner 8 and product runner 8c can be readily removed. Specifically, after the molded resin is demolded, the resin formed in the runners 8b and product runners 8c can be readily removed by pushing pins out of the runner ejection hole 2h and gate runner ejection hole 2n of the lead frame 2 from above the upper face.

In addition, the lead frame 2 taken out from the mold has a first resin 14a, which is formed in the dummy cavity halves 9e, on the front face of the frame section 2g as shown in FIG. 18, and a second resin 14b, which is formed in the dummy cavity half 8f, on the back face of the frame section 2g as shown in FIG. 20. As shown in FIG. 22, the first resin 14a and second resin 14b are coupled to each other through resin retaining holes (third holes) 2j formed in the frame section 2g of the lead frame 2. In short, the first resin 14a and second resin 14b are formed into one piece through the resin retaining holes 2j.

Since the first resin 14a and second resin 14b, which are formed in the dummy cavity 11 and located on the front and back face sides, respectively, of the frame section 2g of the lead frame 2, are integrally coupled to each other with the resin buried in the resin retaining holes 2j, the first resin 14a and second resin 14b are not readily separated from the lead frame 2. This can prevent the first resin 14a and second resin 14 from falling off from the lead frame 2 during transportation of the lead frame 2 or other events.

The third resin 14ba in FIG. 22, which is formed in the runner 8b and located on the front face side (back face side in this embodiment) of the frame section 2g is made thicker than the second resin 14b, which is formed in the dummy cavity half 8f and located on the front face (back face in this embodiment) of the frame section 2g. This is because the amount of resin to flow in the runner 8b is far larger than that into the dummy cavity half 8f, and therefore the resin formed in the runner 8b after molding is also thicker than that formed in the dummy cavity half 8f.

Thus, a lead frame 2 with every runner resin removed is obtained.

5. Dam Bar Cutting

After the resin molding is performed on the lead frame 2, the dam bars 2e coupling the outer leads 2b are cut to separate the outer leads 2b from the neighboring outer leads 2b.

6. Plating

After the dam bars are cut, the outer leads 2b are individually plated with Sn, an Sn/Bi alloy, or other metal.

7. Lead Forming

After plating, lead forming is performed. In the lead forming, each of the outer leads 2b is cut and shaped. Specifically, the outer leads 2b are cut in a desired length and folded into a gull-wing shape.

Through the above-described processes, assembly of the QFP 6 shown in FIG. 1 is completed.

<Effect>

The mold 7 of this embodiment includes dummy cavities 11 that are provided at end portions on the downstream sides along resin flow in the runners 8b, and each of the dummy cavities 11 has a gate smaller in cross-sectional area than that of each of the cavities 10 for the QFPs 6. Such a small gate area makes the injection resistance of the resin into the dummy cavities 11 high in comparison with the injection resistance of the resin into the cavities 10, and therefore the dummy cavities 11 will be the last cavities the resin is injected. As a result, at the completion of resin injection, the resin flows inside the dummy cavities 11 at a high velocity; however, an increase in resin velocity inside the product cavities 10 can be avoided.

In other words, wire deformation caused by an increase in resin velocity inside the product cavities 10 can be prevented, thereby improving the yield of the QFPs 6. As a result, the quality and reliability of the QFPs 6 can be improved.

In addition, since the mold 7 is configured such that the gate orifices of the dummy cavities 11 are smaller than those of the product cavities 10 for the QFPs 6, the resin capacity of the dummy cavities 11 can be significantly reduced in comparison with the resin capacity of the cavities 10 which make encapsulation bodies 4 of the QFPs 6. As a result, the amount of resin for the dummy cavities 11 can be reduced, thereby cutting the cost of materials for the QFP 6.

Furthermore, the dummy cavities 11, which are located at end portions on the downstream sides of the runners 8b, provided over the lead frame 2, and the resin retaining holes 2j for the dummy cavities 11, which are located at the end portions on the downstream sides of the runners 8b, provided in the lead frame 2 can make it possible to integrally mold the resin, which is formed over both the front and back faces of the lead frame 2 using the dummy cavity halves 8f, 9e, with the resin, which is formed in the retaining holes 2j.

The integrally molded resin can fixedly hold the encapsulating resin 14 formed over the frame section 2g of the lead frame 2. As a result, the encapsulating resin 14 formed in the dummy cavities 11 can be prevented from dropping off during the resin molding process and processes subsequent thereto. In addition, stable continuous production can be achieved without problems, such as mold breakage.

While the invention made by the present inventors has been described concretely with reference to the foregoing embodiment, it goes without saying that the present invention is not limited to the embodiment and that various modifications can be made without departing from the gist of the invention.

For instance, the semiconductor device in the above-described embodiment is a QFP; however, a small outline package (SOP) and a quad flat non-leaded package (QFN) can be used as the semiconductor device. In other words, the aforementioned semiconductor device can be any types of semiconductor device, but it should be assembled with a lead frame and encapsulated with resin using a mold in a resin molding process.

In addition, the present invention does not limit the die pad over which the semiconductor chip is mounted in the semiconductor device to the exposed type die pad as described in the embodiment, and the die pad can be an embedded-type die pad in which the die pad is buried in an encapsulation body.

What is claimed is:

1. A method for fabricating a semiconductor device comprising the steps of:
   (a) providing a lead frame having a plurality of device formation regions, and a frame section arranged around the device formation regions in plan view;
   (b) after the step (a), placing a plurality of semiconductor chips over the device formation regions, respectively;
   (c) after the step (b), placing the lead frame in a mold having a plurality of cavities, a dummy cavity, and a runner coupled to the cavities and the dummy cavity, the lead frame being placed such that the cavities match with the device formation regions, respectively;
   (d) after the step (c), forming encapsulation bodies that individually encapsulate part of the lead frames and the entire semiconductor chips by flowing encapsulating resin into the cavities through the runner; and
   (e) after the step (d), taking out the lead frame from the mold,
   wherein, after the step (c), the mold with an upper mold half and a lower mold half clamped together has a plurality of first gates that allow the cavities to communicate with the runner, and a second gate that allows the dummy cavity to communicate with the runner, and
   wherein, in the step (d), from the time when the encapsulating resin starts flowing into the mold to the time when the encapsulation bodies are formed in the mold, an orifice of each of the first gates is larger in size than an orifice of the second gate.

2. The method for fabricating the semiconductor device according to claim 1,
   wherein, in a state where the upper mold half and the lower mold half are clamped together, the dummy cavity is located over the frame section of the lead frame.

3. The method for fabricating the semiconductor device according to claim 1,
   wherein, the orifice of the second gate is a part of a hole formed in the frame section of the lead frame.

4. The method for fabricating the semiconductor device according to claim 1,
   wherein, in a state where the upper mold half and the lower mold half are clamped together, the dummy cavity is located over both front and back faces of the lead frame.

5. The method for fabricating the semiconductor device according to claim 4,
   wherein, in the step (d), the dummy cavity located on the front face side of the frame section of the lead frame and the dummy cavity located on the back face side of the frame section of the lead frame are filled with the encapsulating resin.

6. The method for fabricating the semiconductor device according to claim 5,
   wherein, in the step (e) and after the step (e), a first resin is located on the front face side of the frame section of the lead frame, and a second resin is located on the back face side of the frame section of the lead frame.

7. The method for fabricating the semiconductor device according to claim 6,
   wherein, the first resin and second resin are coupled to each other through a resin retaining hole formed in the frame section of the lead frame.

8. The method for fabricating the semiconductor device according to claim 1,
   wherein, in a state where the upper mold half and the lower mold half are clamped together, the dummy cavity is located across a dummy-cavity gate hole formed in the frame section of the lead frame and the resin retaining hole.

9. The method for fabricating the semiconductor device according to claim 1,
   wherein, in a state where the upper mold half and the lower mold half are clamped together, the orifices of the first gates are larger in area than the orifice of the second gate.

10. The method for fabricating the semiconductor device according to claim 1,
    wherein, the height of the orifice of the second gate is equal to the thickness of the lead frame.

11. The method for fabricating the semiconductor device according to claim 1,
    wherein, the resin that is located on the front face side of the frame section and is formed in the runner is thicker than the resin that is located on the back face side of the frame section and is formed in the dummy cavity.

* * * * *